(12) United States Patent
Clarke et al.

(10) Patent No.: US 11,688,891 B2
(45) Date of Patent: Jun. 27, 2023

(54) BATTERY CHARGER WITH BATTERY STATE DETECTION

(71) Applicant: Schumacher Electric Corporation, Fort Worth, TX (US)

(72) Inventors: Patrick J. Clarke, St. Charles, IL (US); John S. Whiting, North Richland Hills, TX (US)

(73) Assignee: Schumacher Electric Corporation, Fort Worth, TX (US)

( * ) Notice: Subject to any disclaimer, the term of this patent is extended or adjusted under 35 U.S.C. 154(b) by 0 days.

(21) Appl. No.: 17/548,918

(22) Filed: Dec. 13, 2021

(65) Prior Publication Data

US 2022/0140411 A1 May 5, 2022

Related U.S. Application Data

(63) Continuation of application No. 17/068,077, filed on Oct. 12, 2020, now Pat. No. 11,201,361, which is a
(Continued)

(51) Int. Cl.
*H01M 10/46* (2006.01)
*H01M 10/42* (2006.01)
(Continued)

(52) U.S. Cl.
CPC ...... *H01M 10/4285* (2013.01); *G01R 31/371* (2019.01); *G01R 31/3835* (2019.01);
(Continued)

(58) Field of Classification Search
CPC .. H02J 7/00032; H02J 7/00047; H02J 7/0036; H02J 7/005; H02J 7/0069;
(Continued)

(56) References Cited

U.S. PATENT DOCUMENTS 5,159,272 A 10/1992 Rao et al.
5,729,115 A 3/1998 Wakefield
(Continued)

FOREIGN PATENT DOCUMENTS

CN 103392133 A 11/2013
EP 2685269 1/2014
(Continued)

OTHER PUBLICATIONS

Google Translation JPH08130838A (May 21, 1996 (Year: 1996).*
(Continued)

*Primary Examiner* — Edward Tso
(74) *Attorney, Agent, or Firm* — Michael Stanley Tomsa; McAndrews, Held & Malloy, Ltd.

(57) ABSTRACT

A battery charger and method is disclosed for detecting when a battery has a low state of health while simultaneously charging or maintaining the battery. A battery charger includes a processor; a non-transitory memory device; a power management device to receive an input power and to output a charging current; a pair of electrical conductors to electrically couple with a battery, and a display electrically coupled to the processor. The display being configured to indicate a bad battery indicator when the battery has a low state of health and whether the battery is good to start.

20 Claims, 15 Drawing Sheets

Related U.S. Application Data continuation of application No. 16/600,757, filed on Oct. 14, 2019, now Pat. No. 10,804,574, which is a continuation of application No. 15/594,822, filed on May 15, 2017, now Pat. No. 10,446,885.

(60) Provisional application No. 62/370,317, filed on Aug. 3, 2016, provisional application No. 62/336,118, filed on May 13, 2016.

(51) Int. Cl.

| | | |
|---|---|---|
| *G01R 31/371* | (2019.01) | |
| *G01R 31/392* | (2019.01) | |
| *G01R 31/3835* | (2019.01) | |
| *H02J 7/00* | (2006.01) | |
| *H01M 10/44* | (2006.01) | |
| *H01M 10/48* | (2006.01) | |
| *G01R 31/364* | (2019.01) | |
| *G01R 31/00* | (2006.01) | |
| *G01R 31/378* | (2019.01) | |
| *G01R 31/3842* | (2019.01) | |
| *G01R 31/379* | (2019.01) | |
| *G01R 1/20* | (2006.01) | |
| *G01R 13/02* | (2006.01) | |
| *G01R 19/00* | (2006.01) | |
| *H01R 13/02* | (2006.01) | |
| *H01R 13/66* | (2006.01) | |

(52) U.S. Cl.
CPC ........ *G01R 31/392* (2019.01); *H01M 10/446* (2013.01); *H01M 10/48* (2013.01); *H02J 7/005* (2020.01); *H02J 7/00032* (2020.01); *H02J 7/0036* (2013.01); *H02J 7/00047* (2020.01); *H02J 7/0049* (2020.01); *H02J 7/0069* (2020.01); *H02J 7/00712* (2020.01); *H02J 7/00714* (2020.01); *H02J 7/00718* (2020.01); *H02J 7/007192* (2020.01); *G01R 1/203* (2013.01); *G01R 13/02* (2013.01); *G01R 19/0069* (2013.01); *G01R 31/006* (2013.01); *G01R 31/364* (2019.01); *G01R 31/378* (2019.01); *G01R 31/379* (2019.01); *G01R 31/3842* (2019.01); *H01R 13/025* (2013.01); *H01R 13/6616* (2013.01); *H01R 13/6625* (2013.01); *H01R 13/6683* (2013.01); *H01R 13/6691* (2013.01); *H02J 7/0048* (2020.01); *H02J 7/007194* (2020.01)

(58) Field of Classification Search
CPC .. H02J 7/00714; H02J 7/00712; H02J 7/0048; H02J 7/007194; H02J 7/00718; H02J 7/007192; H02J 7/0049; H01R 13/6691; H01R 13/6683; H01R 13/6625; H01R 13/6616; H01R 13/025; G01R 31/006; G01R 31/364; G01R 13/378; G01R 31/379; G01R 31/3842; G01R 31/392; G01R 31/371; G01R 31/3835; H01M 50/543; H01M 50/502; H01M 10/4285; H01M 10/446; H01M 10/48
USPC ........ 320/106, 107, 132, 149, 150, DIG. 18; 324/427, 430, 433
See application file for complete search history.

(56) References Cited

U.S. PATENT DOCUMENTS

| | | |
|---|---|---|
| 6,175,211 B1 | 1/2001 | Brotto |
| 6,469,512 B2 | 10/2002 | Singh et al. |
| 6,625,477 B1 | 9/2003 | Wakefield |
| 7,808,211 B2 | 10/2010 | Pacholok et al. |
| 7,834,593 B2 | 11/2010 | Johnson et al. |
| 8,111,037 B2 | 2/2012 | Zhang et al. |
| 8,258,751 B2 | 9/2012 | Esnard |
| 8,319,475 B2 | 11/2012 | Choksi et al. |
| 8,575,899 B2 | 11/2013 | Whiting et al. |
| 8,947,054 B2 | 2/2015 | Johnson et al. |
| 9,244,132 B2 | 1/2016 | Bond et al. |
| 9,267,997 B2 | 2/2016 | Pisu et al. |
| 9,368,269 B2 | 6/2016 | Chen et al. |
| 9,397,513 B2 | 7/2016 | Butler et al. |
| 9,579,990 B2 | 2/2017 | Butler et al. |
| 10,446,885 B2 | 10/2019 | Clarke et al. |
| 11,201,361 B2 * | 12/2021 | Clarke .............. H02J 7/007192 |
| 2005/0088144 A1 | 4/2005 | Pacholok et al. |
| 2006/0017582 A1 | 1/2006 | Lockhart et al. |
| 2010/0090651 A1 | 4/2010 | Sahu et al. |
| 2011/0012561 A1 | 1/2011 | Whiting et al. |
| 2011/0115442 A1 | 5/2011 | Garrastacho et al. |
| 2011/0148424 A1 | 6/2011 | Chiang et al. |
| 2011/0172939 A1 | 7/2011 | Uprety et al. |
| 2012/0249083 A1 | 10/2012 | Garrastacho et al. |
| 2012/0290234 A1 | 11/2012 | Schaefer |
| 2014/0021906 A1 | 1/2014 | Whiting et al. |
| 2014/0115858 A1 | 5/2014 | Pisu et al. |
| 2016/0187432 A1 | 6/2016 | Saint-Marcoux et al. |
| 2018/0143262 A1 | 5/2018 | Kondo |

FOREIGN PATENT DOCUMENTS

| | | |
|---|---|---|
| EP | 2924455 A1 | 9/2015 |
| EP | 2953202 | 12/2015 |
| JP | 08-130838 | 5/1996 |

OTHER PUBLICATIONS

Vector Products, Inc.; Smart Battery Charger Instruction Manual; Published Feb. 2005, pp. 1-8.
Vector Products, Inc, product packaging pp. 1-7, published and distributed throughout the United States beginning in May 2005.
Gould, C. R., et al.; New Battery Model and State-of-Health Determination Through Subspace Parameter Estimation and State-Observer Techniques; IEEE Transactions on Vehicular Technology, vol. 58, No. 8, Oct. 2009 (pp. 3905-3916).
Juang, Larry W.; Online Battery Monitoring for State-of-Charge and Power Capability Prediction; A thesis submitted in partial fulfillment of requirements for the degree of Master of Science (Electrical Engineering) at the University of Wisconsin—Madison 2010 (157 pages).
Baccus Global LLC, Automatic Battery Charger Instruction Manual, Copyright Notice 2013, dated Jan. 2013, pp. 1-22.
Publisher Hearst Communication; Popular Mechanics Issue Mar. 2014, Distributed Throughout the United States (2 pages).
International Search Report and Written Opinion, dated Aug. 4, 2017, in International application No. PCT/US2017/032645, filed May 15, 2017 (6 pages).
Supplementary European search report, dated Oct. 31, 2019, in European application No. EP 17 79 7018 (23 pages).
State Intellectual Property Office, "SIPO," of the P.R.C. Office Action in PRC (China) Patent Application No. 201780026057.0, dated Nov. 2, 2020 (10 pages).

* cited by examiner

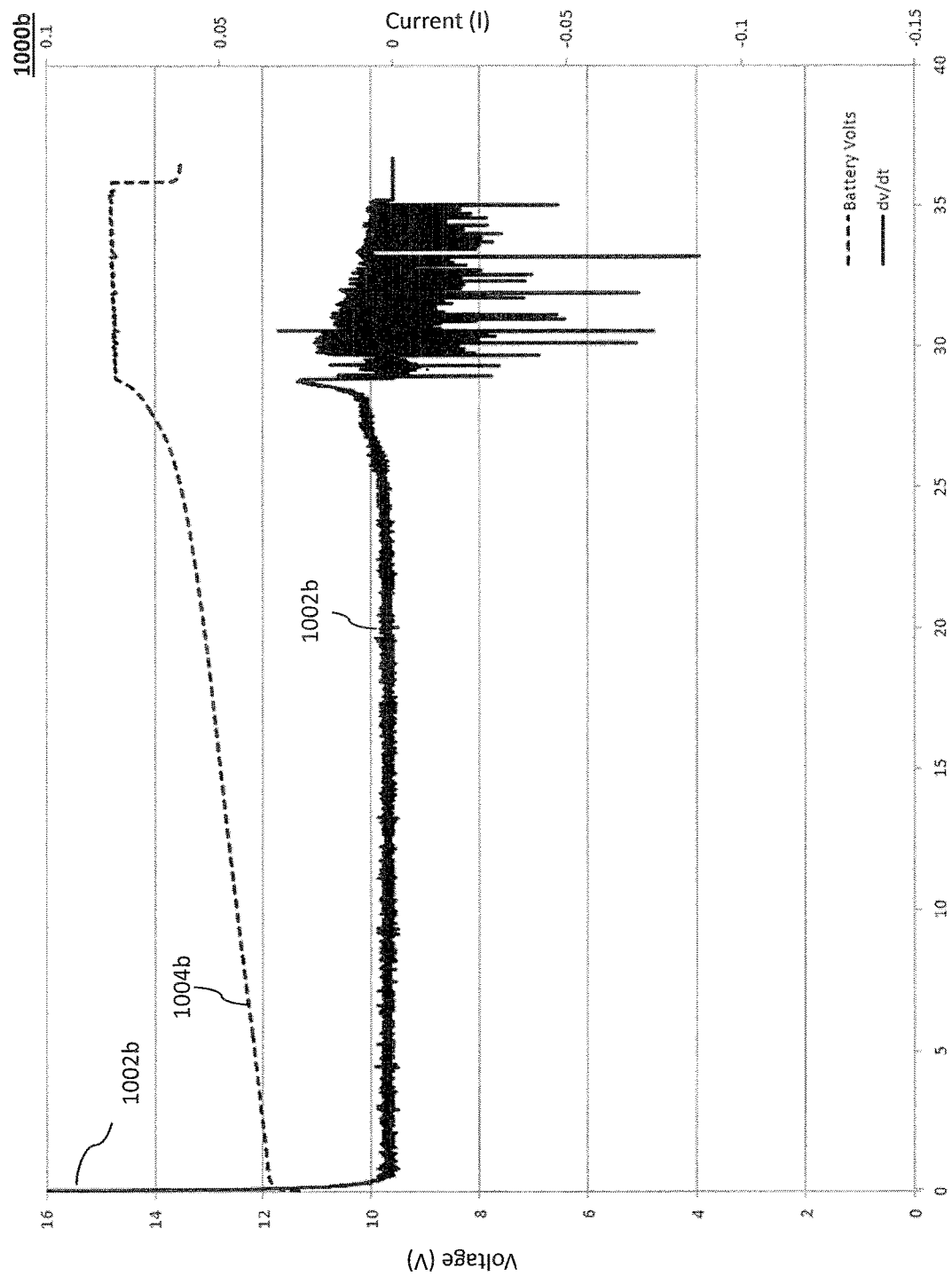

BATTERY CHARGER WITH BATTERY STATE DETECTION

CROSS-REFERENCE TO RELATED APPLICATION

The present application is a continuation of U.S. patent application Ser. No. 17/068,077, filed Oct. 12, 2020, U.S. Pat. No. 11,201,361, issued Dec. 14, 2021, which is a continuation of U.S. patent application Ser. No. 16/600,757, filed Oct. 14, 2019, U.S. Pat. No. 10,804,574, issued Oct. 13, 2020, which is a continuation of U.S. patent application Ser. No. 15/594,822, filed May 5, 2017, U.S. Pat. No. 10,446,885, issued Oct. 15, 2019, which claims the benefit under 35 U.S.C. § 119(e) of Provisional Patent Application Nos. 62/336,118, filed May 13, 2016, and 62/370,317, filed Aug. 3, 2016, the contents of each of which are hereby incorporated by reference.

TECHNICAL FIELD

The subject disclosure relates to a system and method for detecting a battery's state. More specifically, the subject disclosure relates to a battery charger system, method, and apparatus for quickly determining and alerting a user as to a battery's state of health and/or charge using, for example, a bad battery indicator.

BACKGROUND

It is often desirable to know the state-of-charge (SoC) and state-of-health (SoH) of a battery. Rechargeable batteries (e.g., a storage battery, a secondary battery, etc.) are used in many applications, including starting an internal combustion engine of, for example, an automobile, vehicle, or other machinery.

The SoC indicates the charge state of a battery (or an individual battery cell, or a battery pack). The units of SoC are percentage points, where 0% is empty and 100% is full. An alternate form of representing the same measurement is the depth of discharge (DoD), which is the inverse of SoC (i.e., 0% is full and 100% is empty). SoC is normally used when discussing the current state of a battery in use, while DoD is most often seen when discussing the lifetime of the battery after repeated use.

The SoH indicates the health of the battery (or an individual battery cell, or a battery pack). Over time, a battery will age and degrade, causing a decrease in the battery's ability to hold a charge and deliver its rated current to a load. Eventually, the battery will need to be replaced—i.e., once it has degraded to the point that it can no longer effectively hold a charge. The SoH represents the condition of a battery compared to its ideal conditions and/or design specifications. Like the SoC, the units of SoH may be provided as a percentage. For example, a score of 100% indicates that the battery's conditions substantially match the battery's original manufacturing specifications.

As can be appreciated, when charging a battery, in addition to SoC, it is beneficial to determine whether the battery has a low SoH, which may indicate that the battery needs to be refurbished or replaced (i.e., a "Bad Battery"). Thus, a need exists for a system, method, and apparatus for determining and displaying, to the user, a battery's SoH and SoC while the battery is being charged (e.g., during a charging cycle). A need also exists for determining and displaying whether a battery has a SoC and/or SoH sufficient to start an engine.

SUMMARY OF THE INVENTION

Briefly, the subject disclosure relates to a battery charging system, method, and apparatus for determining and alerting a user as to a battery's SoC and/or SoH. More specifically, to a system, method, and apparatus for determining and displaying, to the user, a battery's SoH and SoC and for determining/displaying whether a battery has a SoC and/or SoH sufficient to start an engine.

According to a first aspect, a method for identifying a bad battery condition via a battery charger having a display device during a charging process of a lead acid battery comprises: measuring, using a voltage sensor, a first battery voltage of a lead acid battery connected to the battery charger across a pair of electrical conductors; comparing, using a processor operatively coupled with a memory device, the first battery voltage to a first predetermined voltage value stored to the memory device; measuring, if the first battery voltage is less than the first predetermined voltage value, a second battery voltage of the lead acid battery using the voltage sensor after a first period of time; comparing, using the processor, the second battery voltage to a second predetermined voltage value stored to the memory device; and displaying a bad battery indicator via the display device if the second battery voltage is greater than or equal to the second predetermined voltage value.

According to a second aspect, a battery charger for identifying a bad battery comprises: a processor operatively coupled with a voltage sensor; a non-transitory memory device operatively coupled with the processor; a power management device to receive an input power and to output a charging current during a charging process; a display device electrically coupled to the processor, wherein the display device is configured to display a bad battery indicator; and a pair of electrical conductors to electrically couple with a lead acid battery, wherein, to determine and display whether the lead acid battery has a low state of health, the battery charger is configured to: measure, using the voltage sensor, a first battery voltage of the lead acid battery connected across the pair of electrical conductors; compare, using the processor, the first battery voltage to a first predetermined voltage value stored to the non-transitory memory device; measure, if the first battery voltage is less than the first predetermined voltage value, a second battery voltage of the lead acid battery using the voltage sensor after a first period of time; compare the second battery voltage to a second predetermined voltage value stored to the non-transitory memory device; and instruct the display device to display the bad battery indicator if the second battery voltage is greater than or equal to the second predetermined voltage value.

In certain aspects, the processor is further configured to abort the charging process if the second battery voltage is greater than or equal to the second predetermined voltage value.

In certain aspects, the processor is further configured to commence a desulfation process if the second battery voltage is greater than or equal to the second predetermined voltage value.

In certain aspects, the processor is further configured to measure a third battery voltage of the lead acid battery connected across the pair of electrical conductors after a second period of time if the second battery voltage is greater than or equal to the second predetermined voltage value.

In certain aspects, the processor is further configured to compare the third battery voltage to the second predetermined voltage value.

In certain aspects, the processor is further configured to instruct the display device to not display the bad battery indicator if the third battery voltage is less than or equal to the second predetermined voltage value.

In certain aspects, the processor is further configured to instruct the display device to display the bad battery indicator if the third battery voltage is less than the second predetermined voltage value and lack of progress is detected.

In certain aspects, the processor is further configured to instruct the display device to display the bad battery indicator if the third battery voltage is less than the second predetermined voltage value and a thermal runaway condition is detected.

In certain aspects, the method further comprises the step of aborting the charging process if the second battery voltage is greater than or equal to the second predetermined voltage value.

In certain aspects, the method further comprises the step of commencing a desulfation process if the second battery voltage is greater than or equal to the second predetermined voltage value.

In certain aspects, the method further comprises the step of measuring a third battery voltage of the lead acid battery connected across the pair of electrical conductors after a second period of time if the second battery voltage is greater than or equal to the second predetermined voltage value.

In certain aspects, the method further comprises the step of comparing the third battery voltage to the second predetermined voltage value.

In certain aspects, the method further comprises the step of not displaying the bad battery indicator if the third battery voltage is less than or equal to the second predetermined voltage value.

In certain aspects, the method further comprises the step of displaying the bad battery indicator if the third battery voltage is less than the second predetermined voltage value and lack of progress is detected.

In certain aspects, the method further comprises the step of displaying the bad battery indicator if the third battery voltage is less than the second predetermined voltage value and a thermal runaway condition is detected.

In certain aspects, the first predetermined voltage value may be between 12.0 and 12.4 volts, or about 12.2 volts. The second predetermined voltage value may be between 14.0 and 16.0 volts, or about 14.2 volts.

In certain aspects, the first period of time may be between 1 minute and 10 minutes, or about 5 minutes. The second period of time may be between 1 minute and 10 minutes, or about 5 minutes.

According to a third aspect, a method for identifying a bad battery during a charging process of a lithium battery comprises: measuring, using a voltage sensor, a first battery voltage of a lithium battery connected to the battery charger across a pair of electrical conductors; comparing, using a processor operatively coupled with a memory device, the first battery voltage to a first predetermined voltage value stored to the memory device; supplying a first current from the battery charger to the lithium battery for a first period of time if the first battery voltage is less than the first predetermined voltage value; measuring a second battery voltage of the lithium battery during the first period of time; comparing, using the processor, the second battery voltage to a second predetermined voltage value stored to the memory device; and supplying a second current from the battery charger to the lithium battery if the second battery voltage is (1) greater than the first predetermined voltage value and (2) less than the second predetermined voltage value.

According to a fourth aspect, a battery charger for identifying a bad battery comprises: a processor operatively coupled with a voltage sensor; a non-transitory memory device operatively coupled with the processor; a power management device to receive an input power and to output current during a charging process; a display device electrically coupled to the processor, wherein the display device is configured to display a bad battery indicator; and a pair of electrical conductors to electrically couple with a lithium battery, wherein, to determine and display whether the lithium battery has a low state of health, the battery charger is configured to: measure, using the voltage sensor, a first battery voltage of a lithium battery connected to the battery charger across the pair of electrical conductors; compare, using the processor, the first battery voltage to a first predetermined voltage value stored to the memory device; supply, using the power management device, a first current from the battery charger to the lithium battery for a first period of time if the first battery voltage is less than the first predetermined voltage value; measure, using the voltage sensor, a second battery voltage of the lithium battery during the first period of time; compare, using the processor, the second battery voltage to a second predetermined voltage value stored to the memory device; and supply, using the power management device, a second current from the battery charger to the lithium battery if the second battery voltage is (1) greater than the first predetermined voltage value and (2) less than the second predetermined voltage value.

In certain aspects, the battery charger is further configured to: measure, using a voltage sensor, a third battery voltage of the lithium battery after a second period of time; compare, using the processor, the third battery voltage to the second predetermined voltage value; abort the charging process if the third battery voltage is less than the second predetermined voltage value after the second period of time; and supply a third current to the lithium battery if the third battery voltage is (1) greater than the second predetermined voltage value and (2) less than a third predetermined voltage value.

In certain aspects, the battery charger is further configured to enter a maintenance mode if the third battery voltage is greater than or equal to the third predetermined voltage value.

In certain aspects, the maintenance mode includes periodically supplying a fourth current to the lithium battery.

In certain aspects, the battery charger is further configured to supply the third current to the lithium battery if a measured battery voltage drops below a fourth predetermined voltage value.

In certain aspects, the battery charger is further configured to display a bad battery indicator via a display device on the battery charger if the processor aborts the charging process.

In certain aspects, the battery charger is further configured to display a bad battery indicator via a display device on the battery charger if the third battery voltage is less than the second predetermined voltage value after the second period of time.

In certain aspects, the method further comprises the steps of: measuring, using a voltage sensor, a third battery voltage of the lithium battery after a second period of time; comparing, using the processor, the third battery voltage to the second predetermined voltage value; aborting the charging process if the third battery voltage is less than the second predetermined voltage value after the second period of time;

and supplying a third current to the lithium battery if the third battery voltage is (1) greater than the second predetermined voltage value and (2) less than a third predetermined voltage value.

In certain aspects, the method further comprises the step of entering a maintenance mode if the third battery voltage is greater than or equal to the third predetermined voltage value.

In certain aspects, the maintenance mode includes periodically supplying a fourth current to the lithium battery.

In certain aspects, the method further comprises the step of supplying the third current to the lithium battery if the measured battery voltage drops below a fourth predetermined voltage value.

In certain aspects, the method further comprises the step of displaying a bad battery indicator via a display device on the battery charger if the processor aborts the charging process.

In certain aspects, the method further comprises the step of displaying a bad battery indicator via a display device on the battery charger if the third battery voltage is less than the second predetermined voltage value after the second period of time.

In certain aspects, the first predetermined voltage value may be between 5.0 and 12.4 volts, or about 8.0 volts. The second predetermined voltage value may be between 8.0 and 12.0 volts, or about 10.0 volts. The third predetermined voltage value may be between 14.0 and 15.0 volts, or about 14.2 volts. The third predetermined voltage value may be a fully charged voltage for the lithium battery. The fourth predetermined voltage value may be between 12.5 and 13.5 volts, or about 13.1 volts.

In certain aspects, the first current may be between 0.01 and 0.5 amps, or about 0.1 amps. The second current may be between 0.25 and 1.0 amps, or about 0.5 amps. The third current may be between 1.0 and 3.0 amps, or about 2.0 amps. The fourth current may be between 0.1 and 0.3 amps, or about 0.2 amps.

In certain aspects, the second period of time may be between 1 and 3 hours, or about 2 hours. The first period of time may be less than the second period of time.

According to a fifth aspect, a method for identifying a bad battery condition via a battery charger having a display device during a charging process of a lead acid battery comprises: determining a state of charge for a lead acid battery connected to the battery charger across a pair of electrical conductors; measuring, using a voltage sensor, a first battery voltage of the lead acid battery; measuring, using the voltage sensor, a second battery voltage of the lead acid battery after a first period of time; calculating, using a processor, a first rate of change for the first period of time; and displaying a bad battery indicator via the display device if the first rate of change is greater than or equal to a first predetermined rate of change value.

According to a sixth aspect, a battery charger for identifying a bad battery comprises: a processor operatively coupled with a voltage sensor; a non-transitory memory device operatively coupled with the processor; a power management device to receive an input power and to output current during a charging process; a display device electrically coupled to the processor, wherein the display device is configured to display a bad battery indicator; and a pair of electrical conductors to electrically couple with a lithium battery, wherein, to determine and display whether the lithium battery has a low state of health, the battery charger is configured to: determine a state of charge for a lead acid battery connected across the pair of electrical conductors; measure, using the voltage sensor, a first battery voltage of the lead acid battery; measure, using the voltage sensor, a second battery voltage of the lead acid battery after a first period of time; calculate, using the processor, a first rate of change for the first period of time; and display a bad battery indicator via the display device if the first rate of change is greater than or equal to a first predetermined rate of change value stored to the non-transitory memory device.

In certain aspects, the first predetermined rate of change value may be a function of the state of charge for the lead acid battery.

In certain aspects, the method further comprises the step of: measuring a third battery voltage of the lead acid battery after a second period of time.

In certain aspects, the method further comprises the step of: displaying the bad battery indicator via the display device if the second rate of change is greater than or equal to a second predetermined rate of change value.

In certain aspects, the battery charger is further configured to measure a third battery voltage of the lead acid battery after a second period of time.

In certain aspects, the battery charger is further configured to display the bad battery indicator via the display device if the second rate of change is greater than or equal to a second predetermined rate of change value. The second predetermined rate of change value may be a function of the state of charge for the lead acid battery. The second predetermined rate of change value may be not equal to the first predetermined rate of change value. For example, the second predetermined rate of change value may be less than the first predetermined rate of change value.

In certain aspects, the first and second period of time may be between 30 seconds and 5 minutes, or about 1 minute.

DESCRIPTION OF THE DRAWINGS

These and other advantages of the subject disclosure will be readily understood with reference to the following specifications and attached drawings wherein:

FIGS. 10a and 10b illustrate example charge curves of dv/dt vis-à-vis a battery voltage curve for AGM and flood lead acid batteries.

DETAILED DESCRIPTION

Figure 1A:
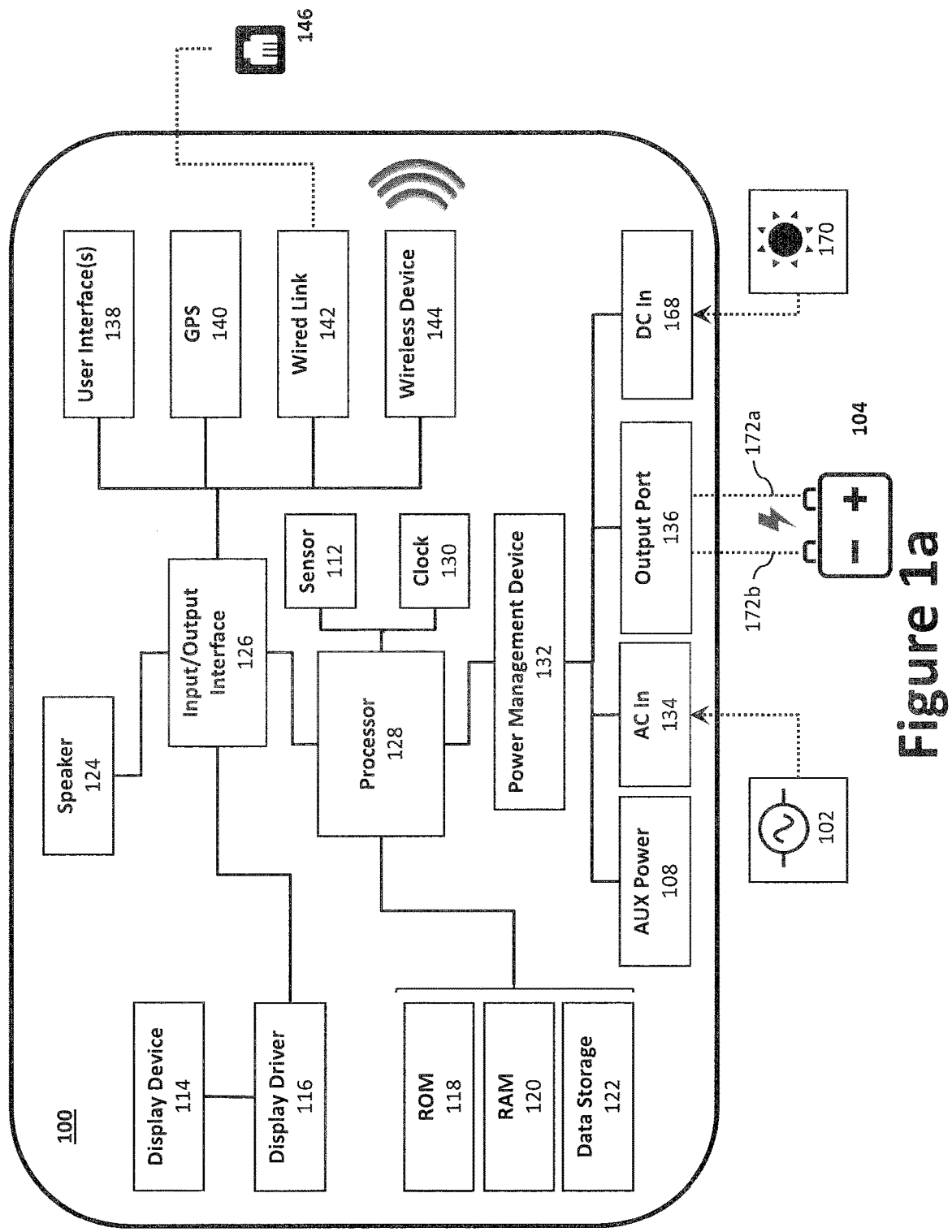
FIG. 1a illustrates a block diagram for an exemplary battery charger.

Preferred embodiments of the present invention will be described hereinbelow with reference to the accompanying drawings. The components in the drawings are not necessarily drawn to scale, the emphasis instead being placed upon clearly illustrating the principles of the present embodiments. For instance, the size of an element may be exaggerated for clarity and convenience of description. Moreover, wherever possible, the same reference numbers are used throughout the drawings to refer to the same or like elements of an embodiment. In the following description, well-known functions or constructions are not described in detail because they may obscure the invention in unnecessary detail. No language in the specification should be construed as indicating any unclaimed element as essential to the practice of the embodiments.

Recitation of ranges of values herein are not intended to be limiting, referring instead individually to any and all values falling within the range, unless otherwise indicated herein, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

In the following description, it is understood that terms such as "first," "second," "top," "bottom," "side," "front," "back," and the like, are words of convenience and are not to be construed as limiting terms. The various data values (e.g., voltages, seconds, etc.) provided herein may be substituted with one or more other predetermined data values and, therefore, should not be viewed limiting, but rather, exemplary. For this disclosure, the following terms and definitions shall apply:

The term "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y, and/or z" means "one or more of x, y, and z."

The terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first set of one or more lines of code and may comprise a second "circuit" when executing a second set of one or more lines of code. As utilized herein, circuitry is "operable" to perform a function whenever the circuitry comprises the necessary hardware and code (if any is necessary) to perform the function, regardless of whether performance of the function is disabled, or not enabled (e.g., by a user-configurable setting, factory trim, etc.).

The terms "communicate" and "communicating" as used herein, include both conveying data from a source to a destination and delivering data to a communications medium, system, channel, network, device, wire, cable, fiber, circuit, and/or link to be conveyed to a destination. The term "communication" as used herein means data so conveyed or delivered. The term "communications" as used herein includes one or more of a communications medium, system, channel, network, device, wire, cable, fiber, circuit, and/or link.

The terms "coupled," "coupled to," and "coupled with" as used herein, each mean a relationship between or among two or more devices, apparatuses, files, circuits, elements, functions, operations, processes, programs, media, components, networks, systems, subsystems, and/or means, constituting any one or more of: (i) a connection, whether direct or through one or more other devices, apparatuses, files, circuits, elements, functions, operations, processes, programs, media, components, networks, systems, subsystems, or means; (ii) a communications relationship, whether direct or through one or more other devices, apparatuses, files, circuits, elements, functions, operations, processes, programs, media, components, networks, systems, subsystems, or means; and/or (iii) a functional relationship in which the operation of any one or more devices, apparatuses, files, circuits, elements, functions, operations, processes, programs, media, components, networks, systems, subsystems, or means depends, in whole or in part, on the operation of any one or more others thereof.

The term "data" as used herein means any indicia, signals, marks, symbols, domains, symbol sets, representations, and any other physical form or forms representing information, whether permanent or temporary, whether visible, audible, acoustic, electric, magnetic, electromagnetic, or otherwise manifested. The term "data" is used to represent predetermined information in one physical form, encompassing any and all representations of corresponding information in a different physical form or forms.

The term "database" as used herein means an organized body of related data, regardless of the manner in which the data or the organized body thereof is represented. For example, the organized body of related data may be in the form of one or more of a table, map, grid, packet, datagram, frame, file, email, message, document, report, list, or in any other form.

The term "exemplary" means "serving as an example, instance, or illustration." The embodiments described herein are not limiting, but rather are exemplary only. It should be understood that the described embodiments are not necessarily to be construed as preferred or advantageous over other embodiments. Moreover, the terms "embodiments of the invention," "embodiments," or "invention" do not require that all embodiments of the invention include the discussed feature, advantage, or mode of operation.

The term "network" as used herein includes both networks and inter-networks of all kinds, including the Internet, and is not limited to any particular network or inter-network.

The term "processor" as used herein means processing devices, apparatuses, programs, circuits, components, systems, and subsystems, whether implemented in hardware, tangibly embodied software, or both, and whether or not it is programmable. The term "processor" as used herein includes, but is not limited to, one or more computing devices, hardwired circuits, signal-modifying devices and systems, devices and machines for controlling systems, central processing units, programmable devices and systems, field-programmable gate arrays, application-specific integrated circuits, systems on a chip, systems comprising discrete elements and/or circuits, state machines, virtual machines, data processors, processing facilities, and combinations of any of the foregoing.

A number of approaches may be employed to determine a battery's SoH. For example, a first approach calculates the SoH by measuring an internal resistance of a battery. Specifically, a high internal resistance is an indication that the SoH is low. U.S. Patent Publication No. 2011/0172939 A1 to Sandip Uprety discloses an example system and method for determining an internal resistance, SoC, SoH, and/or energy level of a rechargeable battery. The widespread application of different types of batteries, however, yields problems when trying to determine the SoH of a battery based solely on internal resistance. Examples of the different battery types (i.e., chemistries) include, for example, lithium, lithium ion, lithium nickel, lead-acid, nickel-cadmium, nickel-metal hydride, etc.

Simply measuring the internal resistance of the battery to determine the SoH, however, results in inconsistencies across the different battery chemistries. A system that can detect the type of battery, however, and then measure the internal resistance would alleviate these inconsistencies. Further, the SoH can vary with temperature because the internal resistance fluctuates as a function of temperature. Therefore, a temperature sensor may be used to monitor temperature of the battery to further mitigate inconsistencies. Another factor that can affect the internal resistance of the battery is the battery charging process itself.

The battery charger may be configured to perform one or more tests to detect and monitor additional dynamic indications of the battery. For example, the battery charger may perform a full/partial discharge test where the battery is either fully or partially discharged by subjecting the battery to a known constant load. During the discharge time, the battery voltage is monitored and the duration of time necessary for the battery to drop to a predetermined (e.g., established, set, or otherwise determined in advance) voltage is compared with know times of a healthy battery (which may be standard values or based on test data from an initial test of the battery, e.g., upon installation). This comparison allows for the calculation of the SoH of the battery. Drawbacks associated with this approach, however, include its relative expense, time requirements (i.e., it is time consuming to discharge the battery), and requires that the battery be offline during testing.

Historic battery data may be used to determine the SoH of a battery (e.g., via a standalone battery monitoring system). During the aging of a battery, the system dynamically (i.e., continuously in real-time or near real-time) measures and monitors the value of one or more electrochemical parameter(s) of the battery over time to generate a dataset of historic battery data. The SoH of the battery is then determined based on the way the parameter(s) changes over time. However, because historic battery data must accumulate before the degradation of these parameter(s) can be determined, such systems cannot determine the SoH of the battery without first acquiring a historic dataset for the battery. Though it is contemplated that a dataset of historic battery data for a comparable battery (e.g., for a battery of the same model, chemistry, etc.) may be loaded into the battery charger (e.g., via an input/output interface). The capacity of the battery can also be monitored to determine the SoH of a battery. An example method includes charging a battery to its maximum charge potential, and then waiting a predetermined timeframe to measure the open-circuit voltage ($V_{OC}$). The SoH may be determined by comparing the $V_{OC}$ to an ideal $V_{OC}$. An example of such a method is described in U.S. Pat. No. 9,244,132, filed Aug. 17, 2012.

It would be advantageous to provide a battery charger that employs multiple processes to determine the SoH of the battery depending on the present state of the charging process, thereby resulting in a battery charger that can more efficiently and quickly identify a battery having a low SoH and to more quickly alert the user of a "bad battery" condition through a bad battery indicator without requiring that the battery be connected to the charger for an extended periods of time. To that end, the subject disclosure relates to a battery charger system, method, and apparatus for determining and alerting a user as to a battery's SoC and/or SoH. In certain aspects, the battery charger system, method, and apparatus may be further configured to determine whether a battery's SoC and/or SoH is sufficiently high such that it can start a vehicle to alert the user of a "Battery Engine-Start" condition. Even further, the disclosed battery charger system, method, and apparatus may be configured to alert a remote user as to a battery's SoC and/or SoH over a network.

Much of the disclosure will be described in connection with a six-cell nominal 12-volt battery, but the various techniques disclosed herein may be applied to virtually any battery by scaling (up or down) the thresholds (e.g., voltage thresholds) as a function of the number of cells/nominal voltage of the battery. To that end, while various exemplary predetermined voltage values (e.g., voltage thresholds) are described in connection with a six-cell nominal 12-volt battery, it should be understood that the exemplary predetermined voltage values are not intended to be applicable only to six-cell nominal 12-volt batteries. Indeed, the predetermined voltage values and ranges can be scaled up or down for a particular battery as a substantially linear function of the number of battery cells/nominal voltage for that particular battery. For example, if a 10 volt threshold is described in connection with a six-cell nominal 12-volt battery, one of skill in the art would appreciate that the 10 volt threshold may be scaled for a three-cell 6-volt battery by dividing the 10 volt threshold by two because the ratio of the six-cell nominal 12-volt battery to the three-cell 6-volt battery is 2:1. Therefore, unless otherwise indicated herein, each predetermined voltage value and range disclose herein should be understood as also disclosing a value or range on a "per cell" basis and each "per cell" voltage value or range (expressed herein as volts per cell ($V_{CELL}$)) is hereby incorporated into the specification as if it were individually recited herein.

With reference to the figures, a battery charger 100, as disclosed herein, may facilitate both charging and maintaining functions for a battery 104, such as a battery of a vehicle. The battery charger 100 may further provide a float mode to maintain the battery 104 in a fully charged state. The battery charger 100 may also be configured to start (a/k/a "boost", "jump", or "jump start") an engine (e.g., an internal combustion engine) coupled to a battery 104.

The battery 104 may be a starting battery, a storage battery, a marine battery (e.g., a deep cycle battery, which is designed to be regularly deeply discharged using most of its capacity), a storage battery, or another rechargeable battery. Example automobile batteries include, without limitation, lead-acid batteries (e.g., wet/flooded batteries, calcium-calcium batteries, valve-regulated, lead-acid (VRLA) batteries, gel cell, and absorbed glass mat (AGM)), and other rechargeable batteries, such as lithium batteries. The battery charger 100 may be configured to determine, automatically, the battery type/chemistry—AGM, gel, lithium ion, etc.

Depending on the application, the battery 104 may be one of a plurality of nominal voltages (e.g., 6V/12V/24V/36V/48V/etc.) and may employ various battery cell counts and arrangements. Typically, each battery cell in the battery 104 provides a nominal 2-volts. Therefore, a 6-volt battery would employ three battery cells, a 12-volt battery would employ six battery cells, a 24-volt battery would employ 12 battery cells, etc. Accordingly, a desired nominal voltage may be achieved by adapting the number of battery cells in a battery pack, array, etc. For example, a battery commonly used in the automotive industry is a six-cell nominal 12-volt battery. In addition to nominal voltage, the battery 104 may employ one of a plurality of different battery types (i.e., chemistries), such example, lithium, lithium ion, lithium nickel, lead-acid, nickel-cadmium, nickel-metal hydride, etc. Battery types commonly used in the automotive industry include lead acid and lithium.

In operation, the battery charger 100 may indicate to the user the number of ampere-hours put into battery 104, and/or an indication of the SoC and/or SoH of the battery 104. The battery charger 100 may further be configured to receive inputs from the user to identify specifics of the battery 104. For example, if a user inputs a battery size and/or model number, the battery charger 100 will know the battery manufacturer specifications (e.g., the original/target values, including fully charged voltage) and, therefore, may determine and provide the SoH or determine other characteristics of the battery 104 based at least in part on a dynamically measured parameter of the battery 104.

Figure 1B:
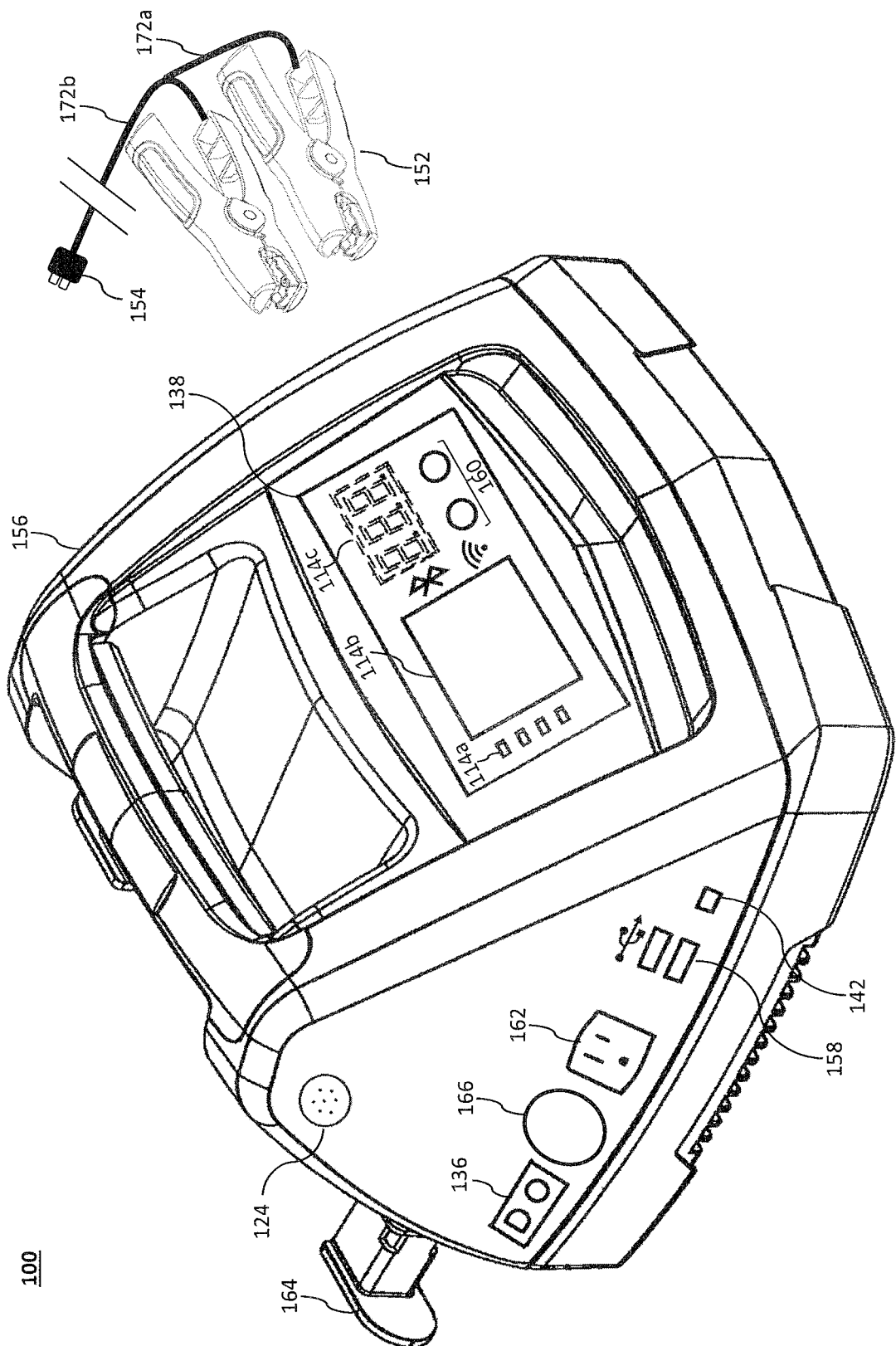
FIG. 1b illustrates a front perspective view of an exemplary battery charger.
Figure 1C:
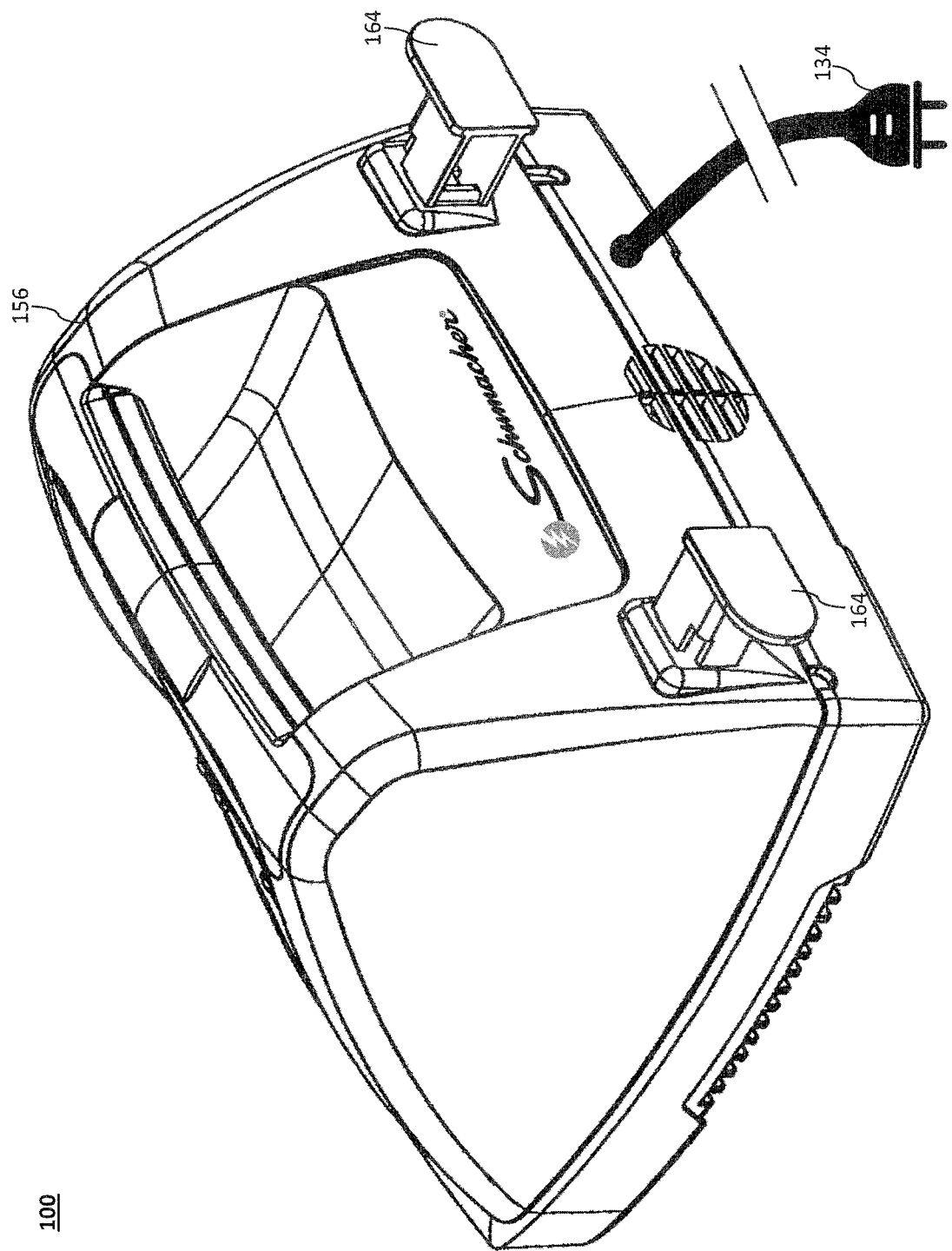
FIG. 1c illustrates a rear perspective view of the exemplary battery charger.

FIGS. 1a through 1c illustrate an example battery charger 100 having a processor 128 (e.g., a central processing unit (CPU)). The processor 128 is operatively coupled to one or more memory devices, such as a read-only memory (ROM) 118 for receiving one or more instruction sets, a random access memory (RAM) 120 having a plurality of buffers for temporarily storing and retrieving information, and/or an internal data storage device 122. The internal data storage device 122 may be, for example, a hard drive (e.g., a solid state drive or other non-volatile data storage device) or another non-volatile data storage device (e.g., flash memory, including removable memory cards). A clock 130 to provide clock/timing signals or pulses may be coupled to the processor 128.

The processor 128 is also operatively coupled with a power management device 132, an input/output interface 126, and a plurality of sensors 112 to provide measurement data descriptive of the surrounding environment, the battery charger 100, and/or the battery 104. Those skilled in the art will understand that the battery charger 100 includes one or more bus structures for interconnecting its various components. Further, to increase ease of use in mobile applications (i.e., to increase portability), the various components of a battery charger 100 may be housed in a single housing. The plurality of sensors 112 may be internal to the battery charger 100 or positioned outside the battery charger 100. The plurality of sensors 112 may include one or more of a voltmeter to measure voltage (i.e., a voltage sensor), an ammeter to measure current, and/or a temperature sensor to measure a temperature, such as the temperature of the environment, the battery 104, the battery charger 100, and/or an auxiliary power source 108. In certain aspects, the processor 128 may receive sensor data from a remote sensor 112 over a wired link 142 or a wireless device 144.

As will be discussed, the processor 128 is configured to perform calculations and comparisons to determine whether the battery 104 is deemed to have a low SoH based at least in part on one or more measured battery parameters from the plurality of sensors 112. For example, the battery charger 100 may be configured to send one or more small AC test signals to the battery 104 and to record the response, thereby calculating the impedance of the battery 104. In another example, the battery charger 100 may be configured to detect automatically the battery type and/or the nominal voltage of the battery 104. The battery charger 100 may further include start/stop technology. In other aspects, the processor may be configured to calculate the temperature of the battery 104 based at least in part on measured or calculated impedance, which can indicate heat dissipation through resistive loss.

Power Management Device 132. A power management device 132 can be used to manage power needed to operate the battery charger 100 (and components thereof) and to charge (or boost) the battery 104. That is, alternating current (AC) power may be drawn from an AC power supply 102 via an AC input device 134, converted to direct current (DC) power using an AC-to-DC converter, and used to charge battery 104 using one or more transformers pursuant to one or more selectable charging modes. For instance, the battery charger 100 may be removably coupled with an AC power supply 102 located outside the housing (e.g., 110-120 VAC line current from a wall outlet) via the AC input device 134 (e.g., a plug). In addition to, or in lieu of, the AC input device 134, the battery charger 100 may be coupled (e.g., removably) with a solar power supply 170 (or other external DC power supply) via a DC input device 168. The one or more transformers may include a linear transformer, a switched mode transformer, or a combination thereof. For example, the battery charger 100 may employ a hybrid of linear and switched mode transformers. An exemplary hybrid battery charger is disclosed by commonly owned U.S. Pat. No. 9,368,269 by Xiao Ping Chen et al., issued Jun. 14, 2016, and titled "Hybrid Battery Charger."

The battery charger 100 can be removably coupled with the battery 104 (e.g., at its battery posts/terminals) via a pair of electrical conductors 172a, 172b electrically coupled with the battery charger 100 via the DC output 136. Each of the electrical conductors 172a, 172b may be, for example, a battery cable having a terminal connector (e.g., a battery clamp 152, a ring connector, etc.) at its distal end. The proximal end of the electrical conductors 172a, 172b may be removably coupled with the battery charger 100 at the DC output 136 via, for example, one or more detachable electrical ports/connectors 154 (e.g., EC5 connectors, barrel connectors, pin connectors, etc.). In another example, the proximal end of the electrical conductors 172a, 172b may be fixedly coupled with the battery charger 100. The housing 156 of the battery charger 100 may further include one or more cable wrapping posts 164 and/or a cable reel, around which various cords may be wrapped.

Figure 8:
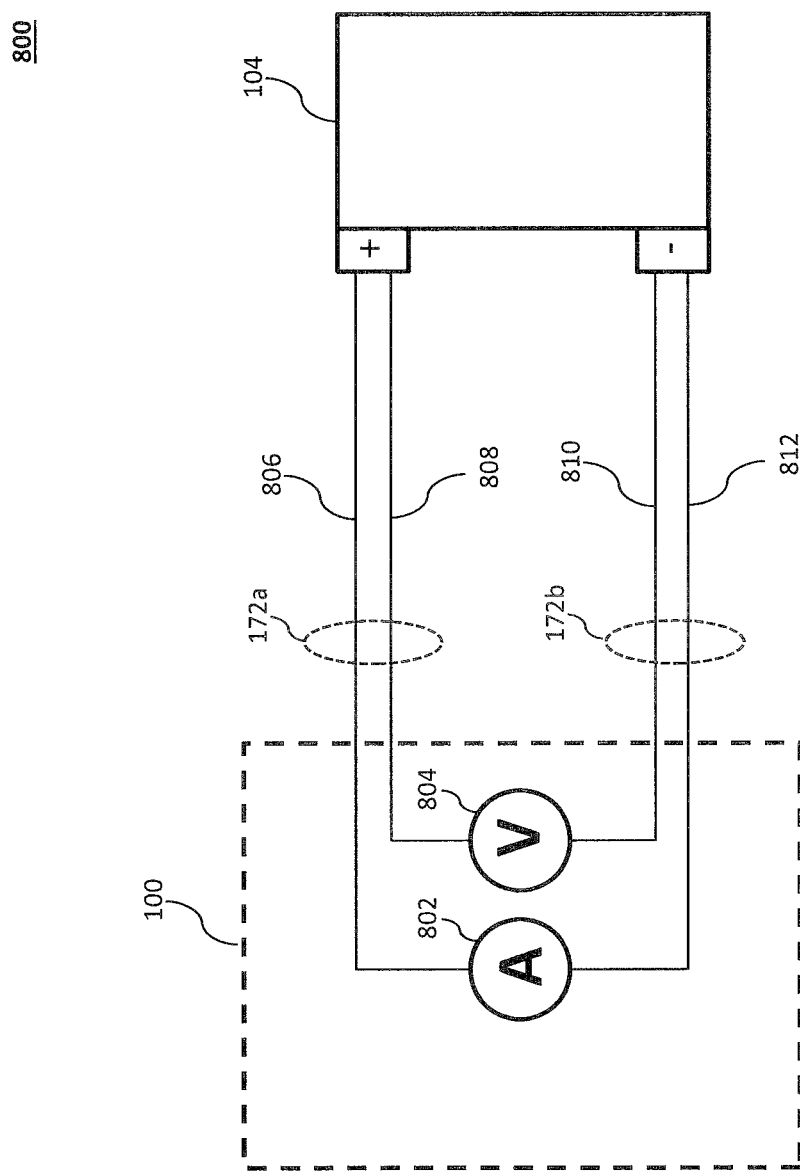
FIG. 8 illustrates a circuit diagram of an exemplary connection between a battery and a battery charger.
Figure 9:
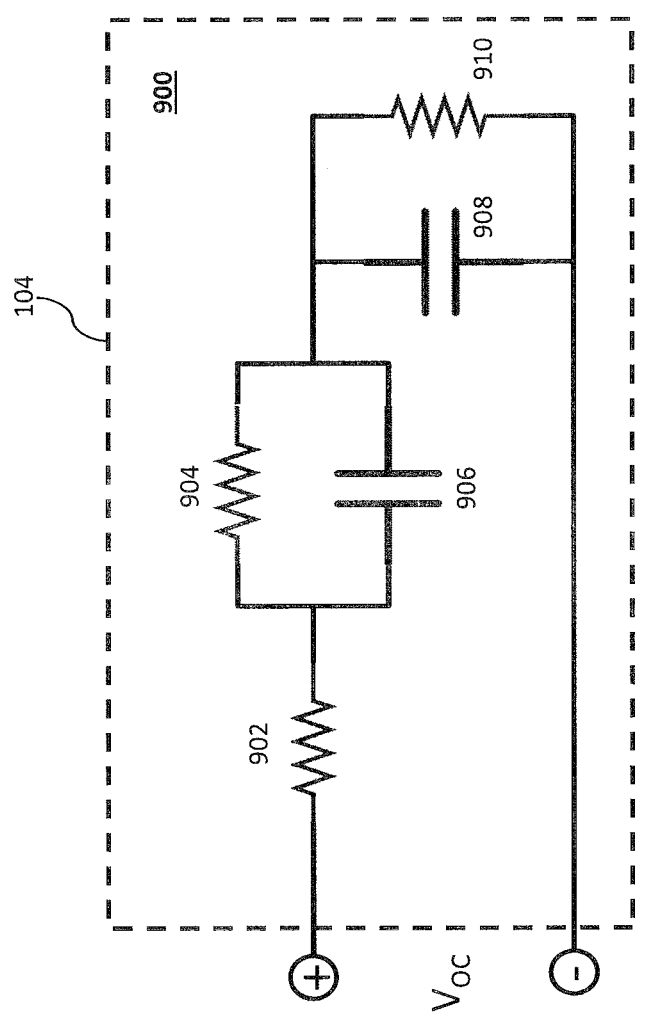
FIG. 9 illustrates a circuit diagram of a resistor-capacitor circuit model for a lead-acid battery.

In addition to conveying a charging current and/or boosting current to the battery 104, the battery charger 100 can also measure, inter alia, the battery voltage of the battery 104 and/or the current through the battery 104 via the electrical conductors 172a, 172b. The electrical conductors 172a, 172b may employ, for example, battery clamps 152 capable of Kelvin sensing (four terminal sensing). Kelvin sensing is an electrical impedance measuring technique that uses two separate pairs of current-carrying and voltage-sensing electrodes per conductor 172a, 172b to provide more accurate measurements than two-terminal (2T) sensing. To that end, each of the electrical conductors 172a, 172b may employ multiple electrically isolated electrodes (i.e., cables, conductors, wires, etc.), whether sharing an insulated outer casing or otherwise bundled. By way of illustration, each of the electrical conductors 172a, 172b may employ two electrodes and provide two battery contacts (e.g., via battery clamps 152 capable of Kelvin sensing) as illustrated in FIG. 8. Specifically, FIG. 8 illustrates a circuit diagram 800 of an exemplary connection between a battery charger 100 and a battery 104 where electrodes 806 and 812 are configured to apply and sense current using an ammeter 802 and electrodes 810 and 808 are configured to sense voltage using a voltmeter 804. As illustrated, electrodes 806 and 808 are provided via a first conductor 172a, while electrodes 810 and 812 are provided via a second conductor 172b.

In certain aspects, Kelvin sensing may be simulated using three electrodes. For example, with separate load and sense electrodes at one battery terminal and a single (common) electrode on the other terminal. Voltage drop in the common electrode is compensated for by assuming that it is the same as in the load electrode, of the same gauge and length. While the subject disclosure primarily discusses embodiments where the battery charger 100 measures parameters of the battery 104 via the electrical conductors 172a, 172b, the battery charger 100 may receive dynamically monitored battery parameters via the wired link 142 or the wireless device 144.

The DC power from the power management device 132 may be further used to charge an internal auxiliary power source 108 (e.g., a supercapacitor, a rechargeable lithium ion battery, or lead-acid battery) via the AC input device 134. In operation, when external power (e.g., the AC power supply 102) is unavailable (e.g., disconnected or out of service), the battery charger 100 may draw the power needed to operate the battery charger 100's components from the battery 104 and/or auxiliary power source 108, thereby enabling the user to determine the status of the battery charger 100 (including SoH, SoC, or other parameters of the battery 104) even when AC power supply 102 is unavailable (e.g., when a circuit breaker is blown). To that end, the battery charger 100 may report the AC power supply 102 failure (e.g., as an alert) to the one or more interface devices (e.g., a portable electronic device 110) via the communication network 106.

In certain aspects, the power management device 132 may be configured to charge and monitor, in addition to automotive batteries, one or more portable user devices (e.g., cell phones, computers, etc.) or AC-powered devices coupled to the battery charger 100. To that end, one or more DC output ports (e.g., USB ports 158 or other DC sockets 166, such as 12-volt DC cigarette lighter ports) may be provided on the housing 156 of the battery charger 100. The USB ports 158, for example, may output a charging current of 3.0 to 5.0 A at 5 VDC. Further different currents may be provided such that one USB port may provide a charging current of 1.0 A at 5 VDC, while a second USB port may provide a charging current of 2.1 A/2.4 A/3.0 A/etc. at 5 VDC to yield faster charging (e.g., for larger devices). To activate the DC output ports, one or more DC power buttons (or other user selectable element, such as a digital soft button) may be provided on the housing 156 via a user interface 138 or remotely over a network (e.g., with a portable electronic device 110 over a communication network 106). The DC output port(s) may be activated by pressing the DC power button, and disabled by, for example, pressing the DC power button a second time, two or more times in quick succession, or held for a predetermined timeframe. Similarly, an AC output port 162 may be provided to output AC current to an AC powered device. The AC output port 162 may employ a pass through to convey AC power from the AC input device 134, which may bypasses the power management device 132. In another aspect, the power management device 132 may include an inverter to convert DC power stored to the internal auxiliary power source 108 to a desired AC power signal (e.g., 110 to 120 volt AC at 60 Hz).

The battery charger 100 may employ one or more charging techniques, including conventional, fast charging, and the like. The power management device 132 and processor 128 may provide one or more features, such as reverse hook-up protection, automatic battery voltage detection, and battery type detection. Commonly owned U.S. Pat. No. 7,808,211 discloses an example of a switched-mode battery charger for automotive and marine battery applications. Further, commonly owned U.S. Pat. No. 8,947,054 discloses a battery charger and method utilizing alternating DC charging current, while commonly owned U.S. Pat. No. 8,575,899 discloses a battery charger with automatic voltage detection.

The battery charger 100 may be further configured to determine, automatically, different battery chemistry (e.g., AGM, gel, lithium ion, etc.) and the battery's 104 nominal voltage. The charging characteristics of a battery charger may be configured to match the battery chemistry of the battery 104 to be charged. For example, lead-acid batteries may be charged with constant power, constant current, constant voltage, or combination thereof. Such batteries may be charged using both linear and/or switched-mode (high frequency) transformers. In addition to charging and/or maintaining the battery 104, the power management device 132 and processor 128 may provide jump-starting functionality. For example, the battery charger 100 may use one or more of the auxiliary power source 108, the linear transformer, and/or switched mode transformer to provide the jump-starting functionality to jump-start the vehicle. Exemplary battery-boosting functionality that may be incorporated is disclosed by commonly owned U.S. Pat. No. 9,397, 513 by Brian F. Butler et al., issued Feb. 18, 2016, and titled "Compact Multifunctional Battery Booster."

While the power management device 132 and processor 128 are illustrated as separate components, one of skill in the art would appreciate that power management functionality (e.g., battery charging, battery maintaining, etc.) may be provided as a single component that combines the functionality of the power management device 132 and processor 128.

Input/Output Interface 126. The battery charger 100 may further include an input/output interface 126 to interface the processor 128 with one or more peripheral and/or communicative devices, such as a user interface(s) 138, a Global Positioning System (GPS) transmitter 140, the wired link 142, the wireless device 144, and a speaker 124, which may be used to signal an alert (e.g., SoH, SoC, charge complete, error, etc.) or other status information.

The wired link 142 and the wireless device 144 may be provided to manage communication and/or transmission of signals or data between the processor 128 and another device. The wired link 142 may be a port (and/or cable) to wiredly couple with another data port 146 positioned outside the battery charger 100, such as on-board diagnostics (OBD) data ports and other data ports (e.g., RS-232, Universal Serial Bus (USB), and/or Ethernet ports). The wireless device 144 may be a wireless transceiver configured to communicate via one or more wireless standards such as Bluetooth (e.g., short-wavelength, Ultra-High Frequency (UHF) radio waves in the Industrial, Scientific, and Medical (ISM) band from 2.4 to 2.485 GHz), near-field communication (NFC), Wi-Fi (e.g., Institute of Electrical and Electronics Engineers' (IEEE) 802.11 standards), etc. The user interface(s) 138 may further provide one or more connection status icons to indicate the connection status of the wired link 142 and/or the wireless device 144.

The processor 128 may be operatively coupled to a display device 114 via a display driver 116. The display device 114 may comprise one or more light emitting diodes (LEDs) 114*a*, a liquid crystal display (LCD) screen 114*b*, and/or a segmented display device 114*c*. For example, the display device 114 may be an alphanumeric segmented LED/LCD display or a matrix LCD display. In certain embodiments, the display device 114 may further provide touch screen functionality to facilitate a user input device via a thin layer of sensing circuitry present either beneath the visible portion of display device's 114 surface, or as part of a thin, clear membrane overlying the display device 114 that is sensitive to the position of a pen or finger on its surface.

The display device 114 may be used to provide an indication of a poor SoH for a battery, indicating a "Bad Battery" or "Battery Good To Start" indicator, which may be compatible with multiple nominal battery voltages, chemistries, and constructions; including, for example, 6-, 8-, 12-, 16-, 24-volt lead-acid, AGM, GEL, lithium ion, etc.

The "Bad Battery" or "Battery Good To Start" indicators may be text or graphical displays (e.g., an icon on an LCD display) or back-lit displays (e.g., a backlit LED translite). The display device 114 also may be used to indicate an operating mode of battery charger 100. For example, the display device 114 may display that battery 104 is in desulfation mode, and/or to indicate when the battery 104 is charging, fully charged, etc. In operation, the display driver 116 may receive display data from the processor 128 via input/output interface 126 and display that display data via the display device 114. For example, interactive LEDs and/or an easy-to-read digital LCD display may be provided on the housing to provide the user with status information and/or input capability (e.g., via a touch screen).

Once an AC power supply 102 is connected, for example, a first LED may be illuminated to indicate that the battery charger 100 is ready to use. When the AC power supply 102 is connected and the battery charger 100 is successfully connected with the communication network 106 or wireless transceiver 148, a second LED on the unit may be illuminated. Finally, when the DC output 136 are successfully coupled (e.g., clamped, or otherwise electrically coupled) to a battery 104, a third LED may be illuminated. Rather than employing separate LEDs, a single multi-color LED (e.g., a tricolor LED (RGB)) may be employed that changes color depending on the status of the battery charger 100.

The user interface 138 may include user-actuated input devices 160 to enable the user to input commands, switch the charging mode, the battery type, amperage (e.g., 1 A, 10 A, 50 A, etc.), or another setting. Example user-actuated input devices 160 include physical buttons, physical switches, a digitizer (whether a touch pad, or transparent layer overlaying the display device 114), and other input devices. For instance, using the digitizer, a user may control or interact with the battery charger 100 by writing, or tapping on the display device 114 using, a pen, stylus, or finger. The battery charger 100 may be configured to modify an algorithm for a charge cycle based on input (via the input/output interface 126 or the portable electronic device 110) from a user, such as battery type, battery size, geographic location of the battery 104/battery charger 100, and charge history. Indeed, the battery charger 100 can charge the battery 104 differently to compensate for the age of the battery 104 as the battery 104 ages. In certain aspects, if a wrong setting is entered (e.g., by the user), the battery charger 100 may update the setting to a new setting for the next charge cycle.

Figure 1D:
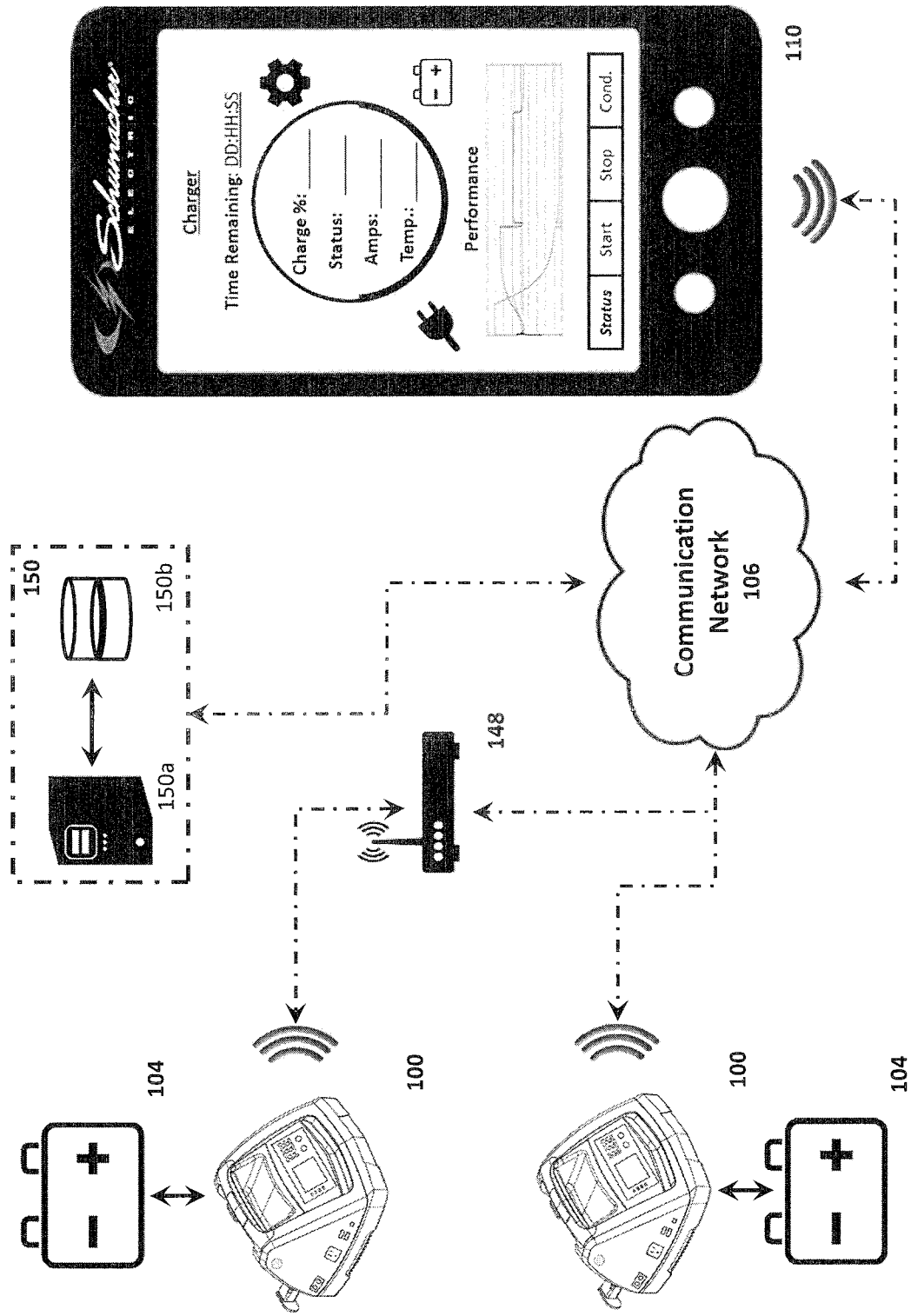
FIG. 1d illustrates a diagram for an exemplary network for a battery charger.

Remote Monitoring/Control. FIG. 1*d* illustrates a battery charging system and network configured to facilitate remote monitoring and control of a remote battery (e.g., battery 104) and/or remote battery charger (e.g., battery chargers 100). As illustrated, the battery charging system may comprise a communication network 106 (e.g., the Internet) that is communicatively coupled, via one or more data transmission devices, with, for example, a battery management server 150, one or more battery chargers 100, and one or more portable electronic devices 110.

In operation, the battery charger 100 may be configured to communicate with one or more portable electronic devices 110 (e.g., phones, tablet computers, portable computers, or other handheld user terminals) within a battery monitoring system via a communication network 106. For example, the battery charger 100 may wirelessly communicate with a wireless transceiver 148 (e.g., Wi-Fi router and/or modem), which, in turn, may be wiredly couple to a network 106. In other aspects, the battery charger 100 may wirelessly communicate directly with one or more portable electronic devices 110 (e.g., via Bluetooth, Wi-Fi, NFC, etc.).

The battery management server 150 may be configured to receive data and, therefore, may be communicatively coupled with one or more non-transitory data storage devices 150*b*. In certain aspects, the portable electronic devices 110 may be used to monitor and remotely control the battery charger 100. A suitable example battery monitoring system is disclosed in greater detail by commonly owned U.S. Pat. No. 9,579,990 by Brian F. Butler et al., issued on Feb. 28, 2017, and titled "Battery Charger Status Control System And Method."

Figure 2:
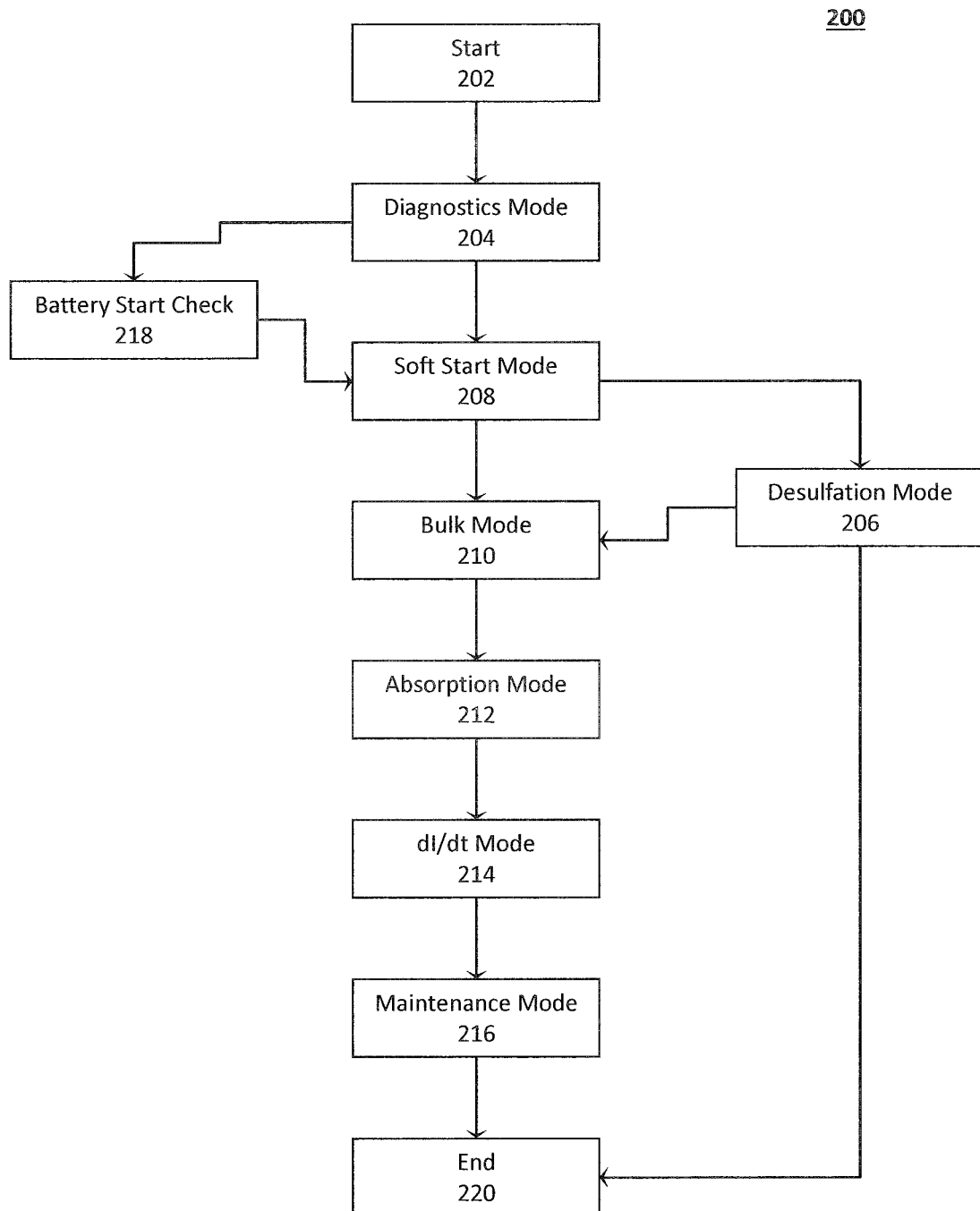
FIG. 2 illustrates a flow diagram of an exemplary battery charging cycle.

Battery Charging Protocol. FIG. 2 illustrates a flow diagram depicting an example battery charging cycle 200. As illustrated, upon startup at step 202 (start mode), the battery charger 100 may be configured to, via said processor 128, cycle through multiple modes, including, for example, a diagnostics mode 204 (which may include nominal voltage detection, battery type detection, etc.), a soft start mode 208, a bulk mode 210, an absorption mode 212, a di/dt charging mode 214, and a maintenance mode 216 before terminating at step 220.

While the example battery charging cycle 200 is illustrated as having seven different modes, one of skill in the art would appreciate that fewer or additional modes may be implemented. For example, one or more modes may be omitted from the battery charging cycle 200, or performed separately and/or upon request from a user. Moreover, the order in which the modes are cycled may be rearranged depending on the needs of the user. Further, at one or more points in the battery charging cycle 200, the processor 128 may perform one or more battery engine-start checks 218 to indicate to the user whether the battery 104 is sufficiently charged and/or in a sufficient SoH to start a vehicle. If the battery 104 is considered by the battery charger 100 (via the processor 128) to be sufficiently charged and/or in a sufficient SoH to start a vehicle, the display device 114 may display "Battery Good To Start" or an equivalent icon. An example battery engine-start detection cycle 700 is described below in connection with FIG. 7.

In start mode 202, the battery charger 100 initializes its various hardware and software systems. For example, the input/output ports on the processor 128 are initialized along with the clock 130. The display device 114 may also be tested and set to its initial state. The various system variables may be initialized (e.g., a default state/value or an initial measured value). In one embodiment, the battery charger 100 enters start mode 202 automatically upon power up (e.g., when plugged into to an AC power supply 102), or upon receipt of an initiation signal, which may be triggered through actuation of a user-actuated input devices 160 on the battery charger 100 (e.g., a power button or a "start charge" button) or over a communication network via a remote portable device.

In diagnostics mode 204, the battery charger 100 may determine, inter alia, one or more characteristics of the battery 104, a vehicle coupled to the battery 104, or the battery charger 100. For example, the battery charger 100 may determine the nominal voltage of the battery 104 and/or the type of battery 104, which can be used to dictate the charging protocol used to charge the battery 104. The nominal voltage and/or the type of battery 104 may be determined as described with regard to FIGS. 3 and 4. The battery charger 100 may also determine whether the battery 104 is properly connected to the DC output 136 by checking for a predetermined measurement across the DC output 136 (e.g., by taking a voltage measurement, a resistance measurement, capacitance measurement, impedance measurement, etc.). For example, battery charger 100 may require that the voltage measured across the DC output 136 meet a predetermined voltage value (e.g., a voltage threshold), such as 0.1 volts.

If the battery 104 is not properly connected to the DC output 136, the display device 114 may indicate accordingly (e.g., the LCD may display "Battery Not Connected" or an LED may be illuminated). During diagnostics mode 404, the battery charger 100 may measure and record one or more parameters of the battery 104 such as, the maximum voltage ($V_{MAX}$) and minimum voltage ($V_{MIN}$) of battery 104. In certain aspects, the processor 128 may further be configured to perform a battery engine-start check 218 during diagnostics mode 404 to determine and/or display whether the battery 104 is sufficiently charged and/or in a sufficient SoH to start a vehicle. Alternatively, the battery engine-start check 218 may be triggered through actuation of a user-actuated input device 160 or over the communication network 106 via a remote portable electronic device 110.

In soft start mode 208, the battery charger 100 may output a reduced charging current. For example, a soft start mode 208 may run for a shortened timeframe (e.g., 1 to 10 minutes, more preferably about 2 minutes). During the soft start mode 208, the battery charger 100 charges the battery 104 using a reduced charging current (e.g., about half the maximum charging current for a given battery type until the battery reaches a predetermined state of charge). Assuming a lead-acid battery is used and/or detected, the battery charger 100 may determine whether the battery 104 is sulfated during the soft start mode 208.

The soft start mode 208 may also be used to determine the capacity of the battery. The rate of change of the battery voltage (as a function of the SoC of the battery) during the charging mode is used to determine the actual capacity of the battery. As a battery ages the actual capacity drops below the rated capacity (which is dictated by the battery manufacturer specifications). Manually setting the charging current based on a percentage of rated battery capacity can damage the battery. Charging a six-cell 12-volt battery at 20% capacity (i.e., a 0.2 C battery), for example, would generate a rate of change of voltage of about 0.0175 V/min. At 10% capacity (i.e., 0.1 C), however, the rate of change would be about 0.00875 V/min. Therefore, the SoC of the battery 104 may first be determined to identify an expected rate of change for the voltage. For example, if the SoC is calculated to be between 10 and 20%, the battery charger 100 may vary the charge current during the soft start mode 208 until the rate of change of voltage is 0.00875 V/min and 0.0175 V/min (which is expected for a rate of change of the battery voltage in the 0.1 to 0.2 C range) to determine the correct charging current.

The battery charger 100 also dynamically monitors for a sulfation condition, which is a condition that occurs in lead-acid batteries where the battery cannot hold a charge due to the crystallization of lead sulfate. The desulfation mode 206 may employ a process of repeatedly sending short current surges through the sulfated/damaged battery. The current pulses tend to break down and dissolve the sulfate crystals, restoring some of the battery's 104 capacity over time. To identify a sulfation condition, the battery charger 100 may dynamically monitor the battery voltage for rapid increases in battery voltages. If the battery 104 is not sulfated, or if the battery 104 is not a lead-acid battery, the battery charging cycle 200 may proceed to bulk mode 210. For example, if the peak voltage in a nominal six-cell 12-volt voltage battery is greater than a first predetermined value (e.g., 11 volts, which is 1.834 $V_{CELL}$), but the initial voltage is less than a second predetermined voltage (e.g., 3 volts, 0.5 $V_{CELL}$), the processor 128 assumes a sulfation condition exists and initiates a desulfation process at step 206.

During the desulfation mode 206, the display device 114 may indicate that the battery charger 100 is in desulfation mode (e.g., displaying "Battery Sulfated" or equivalent icon) or the status may be communicated to a portable electronic device 110. If the desulfation process is successful (i.e., the battery 104 is restored/usable), the charge cycle proceeds to step 210, otherwise the process continues to step 220 and a bad battery indication is provided via display device 114 (e.g., "Battery Sulfated" or a representative icon). An exemplary desulfation process 500 is described below in connection with FIG. 5.

In bulk mode 210, the battery charger 100 may output a maximum charging current while the voltage increases. A bulk mode 210 may be run for a second timeframe or until the battery 104 received a predetermined SoC (e.g., 80 to 90% of the batteries rated capacity) and commences after the soft start mode 208. For example, charging a 100 AH battery with a 10 A charger would take approximately 8 hours in the bulk mode 210 to reach 80 AH (80% capacity or 0.8 C), without taking into account any losses in the charging process. During the bulk mode 210, the battery charger 100 charges the battery 104 using a constant maximum current until the battery 104 rises to an absorption mode 212 level. In other words, the battery charger 100 can provide the maximum amount of current that the battery 104 will accept (up to charger capacity, e.g., 25% of battery capacity in amp hours). The temperature of the battery 104 may also be monitored (e.g., directly via a sensor 112, such as a thermometer, or indirectly as a function of the current supplied to the battery and measured battery parameters) to ensure that it does not exceed a predetermined temperature (e.g., 125° F. for a wet battery, 100° F. for an AGM or GEL, etc.).

In absorption mode 212, the battery charger 100 may output a predetermined charging current until the SoC of the battery achieves a predetermined charge percentage (e.g., 80-90%). If the SoC of the battery 104, for example, fails to achieve a predetermined charge percentage within a period of time (e.g., a predetermined period of time value stored to the memory device), the display device 114 may indicate that the battery is bad (e.g., displaying "Bad Battery" or equivalent icon).

Absorption mode 212 begins at the start of di/dt, which is the rate of change of the charge current (i) over time (t). In di/dt charging mode 214, for example, the battery charger 100 may hold the battery voltage constant and wait for the charge current to level off, or at least stop declining, which is the preferred over setting a current limit (e.g., 0.5 amps) because certain batteries can draw a greater number of amps (e.g., 2.0 amps or more) even when fully charged. A di/dt charging mode 214 exploits the fact that, as the battery 104 charges at a constant voltage, the current rise slows and eventually stops. In other words, at a constant voltage, the decrease in current slows and eventually flat lines. Further, if the battery charger 100 detects that the current has increased, the battery charger 100 may conclude that the battery 104 is in thermal runaway condition.

The di/dt charging mode 214 may initiate when the measured battery voltage dips below a predetermined voltage after charging for more than a predetermined timeframe (e.g., within 48 hours, more preferably within about 36, most preferably within about 24 hours), or the predetermined timeframe has elapsed since the last point of progress (voltage increasing), or battery voltage is greater than the maximum voltage. This maximum voltage may be the maximum voltage for the battery type or the current battery voltage if greater than a predetermined voltage (e.g., 14.2 volts for a 12-volt battery, 2.367 $V_{CELL}$) and the current battery voltage is not increased within a preceding timeframe (e.g., the prior 5 to 60 minutes, more preferably the prior 30 minutes).

The di/dt charging mode 214 may also end if the charge current drops below a predetermined current (e.g., 100-500 mA, more preferably about 200-300 mA) and/or the percent charge reaches 100% (or another near capacity value). Two other conditions that may terminate the di/dt charging mode 214 include, for example, where the current increases more than a predetermined current (e.g., about 250 mA) in more than 1 minute and where the current does not decrease within a predetermined period (e.g., about 30 minutes). The duty cycle of charging current is repeatedly monitored. In general, the voltage is held constant at $V_{MAX}$ by continuously reducing the current by reducing the duty cycle. Once the current levels off and the voltage is maintained, the system assumes that the battery 104 is fully charged. Once the battery 104 is fully charged, the system enters a maintenance mode 216.

In maintenance mode 216, the battery charger 100 dynamically monitors the current that the battery 104 is drawing to maintain the battery 104 in a fully charged state. During maintenance mode 216, the charge voltage may be reduced and held constant at a predetermined voltage (e.g., for a 12-volt lead-acid battery, between 13.0 VDC and 13.8 VDC, i.e., 2.167 to 2.3 $V_{CELL}$), while the current is reduced to less than 1% of battery capacity. If the current that the battery 104 draws is more than a predetermined value for a predetermined time value, then the display device 114 will indicate that the battery 104 is deemed to have a low SoH. For example, in one embodiment, if the battery 104 is drawing more than 1.0 A for more than 12 hours, then the display device 114 will indicate that the battery 104 is bad.

Bad Battery Detection. While in the various charging modes, the battery charger 100 dynamically monitors the battery charging progress and various battery parameters via the one or more sensors 112 to identify a bad battery. The process for detecting a bad battery may adjusted depending on the type of battery, the nominal voltage, and/or the current mode of the charging process.

In one aspect, the processor 128 can dynamically monitor whether the $V_{MIN}$ and $V_{MAX}$ of the battery 104 connected across the DC output 136 is greater than or equal to a stored $V_{MAX}$, where the stored $V_{MAX}$ represents the previously measured highest voltage of the battery 104. If the voltage of the battery 104 connected to the DC output 136 is greater than or equal to $V_{MAX}$, then $V_{MAX}$ is set to the current value of the voltage of the battery 104 connected to the DC output 136. During the charging period, the system also continually checks whether the voltage of the battery 104 connected to its DC output 136 is less than or equal to $V_{MIN}$. $V_{MIN}$ represents the previously measured lowest voltage of the battery 104. If the voltage of the battery 104 connected to the DC output 136 is less than or equal $V_{MIN}$, then $V_{MIN}$ is set to the present value of the voltage of the battery 104 connected across the DC output 136. During a charging cycle, the processor 128 continuously monitors the difference between $V_{MAX}$ and $V_{MIN}$. If the difference between the $V_{MAX}$ and $V_{MIN}$ (i.e., a rate of change) is more than a predetermined value, then the battery 104 is deemed to have a low SoH and the display device 114 will indicate accordingly that the battery 104 is bad. The difference between the $V_{MAX}$ and $V_{MIN}$ should be less than a predetermined value, which may be a function of the SoC (e.g., the rate of change at 10% of the rating of the battery, such as 0.00875 V/min or 0.525 V/hour).

In another aspect, the processor 128 can dynamically monitor the voltage of the battery 104 connected across the output terminals to detect a bad battery. For instance, if the battery 104 voltage does not exceed predetermined threshold voltages after predetermined amounts of time, then the battery 104 is deemed to have a low SoH. The display device 114 will indicate accordingly that the battery 104 is bad. For example, if for a nominally 12-volt battery the voltage of battery 104 is less than or equal 10 volts (1.667 $V_{CELL}$) for more than two hours, then the charging will abort and the display device 114 will indicate that the battery 104 is bad. Another low SoH indication for a battery 104 is lack of progress. For example, lack of progress can be identified when the voltage of the battery 104 does not increase by a predetermined voltage amount during a predetermined timeframe. For example, in a six-cell nominal 12-volt battery, if the voltage is below a predetermined voltage (e.g., a fully charged voltage, such as 14.2 volts, 2.367 $V_{CELL}$) and the voltage does not increase by at least 0.05 volts (0.008333 $V_{CELL}$) in a predetermine period of time (e.g., 5 minutes to 60 minutes, or about a 20-minute period), then the charging will abort and the display device 114 will indicate that the battery 104 is bad.

By way of illustration, an example bad battery process for identifying a bad battery condition via a battery charger 100 having a display device 114 during a charging process of a six-cell nominal 12-volt lead acid battery 104 will be described in accordance with one embodiment. Upon start up, the battery charger 100 determines, via a processor 128 and a sensor 112 (e.g., a voltage sensor), a state of charge for a lead acid battery 104 connected to the battery charger 100 across a pair of electrical conductors 172a, 172b. The battery charger 100 then measures, using the voltage sensor, a first battery voltage of the lead acid battery 104. After a first period of time (e.g., a first predetermined period of time value stored to the memory device), the battery charger 100 then measures, using the voltage sensor, a second battery voltage of the lead acid battery 104. Using the first and second battery voltages as a function of the first period of time, the battery charger 100 may calculate (via processor 128) a first rate of change for the first period of time. If the first rate of change is greater than or equal to a first predetermined rate of change value (e.g., a predetermined rate of change value stored to the memory device), the battery charger 100 may display a bad battery indicator via the display device 114. As can be appreciated, the first predetermined rate of change value may be a function of the state of charge for the lead acid battery 104. For example, a higher rate of change would be expected in a battery at a higher state of charge.

Therefore, the battery charger 100 may measure a third battery voltage of the lead acid battery 104 after a second period of time (e.g., a second predetermined period of time value stored to the memory device). The battery charger 100 may display the bad battery indicator via the display device 114 if the second rate of change is greater than or equal to a second predetermined rate of change value. The rate of change is expected to be higher (e.g., spike) at the start of a charge cycle. Therefore, different rate of change values may be employed throughout the charge cycle as a function of charge time (i.e., depending on the elapsed time). Therefore, the second predetermined rate of change value may be not equal to the first predetermined rate of change value. For example, the second predetermined rate of change value may be less than the first predetermined rate of change value. The first and second period of time may be the same, for example, between 30 seconds and 5 minutes, or about 1 minute.

Thermal Runaway Detection. During the various charging modes, the battery charger 100 may also check for a thermal runaway condition. A thermal runaway condition exists when the electrical conductors and/or electrolyte in the battery 104 increase in temperature during a charging cycle. Since, the resistance of an electrical conductor is inversely proportional to the temperature of the conductor, the resistance of the electrical conductor decreases as temperature increases. Thus, if the battery charger 100 is providing a constant voltage to the battery 104 under charge, the current will increase in proportion to the decrease in resistance. During such a condition, the battery 104 voltage does not increase even though the charging current is increased, instead either remaining the same or decreasing.

During an initial phase of a normal charging cycle, the voltage of the battery 104 will continually ramp up to a predetermined value or to a point at which dv/dt:0. Further, a decreasing amount of charging current is typically required to maintain a constant battery voltage. In view of these tendencies, a number of techniques may be used to detect a thermal runaway condition during the initial phase by monitoring the voltage and charging current of the battery 104. For example, the processor 128 can identify a thermal runaway condition when an increase in charging current is detected or an increase is detected with respect to time, i.e. di/dt.

Consequently, the processor 128 can monitor the duty cycle of the charging current and track the trend in the duty cycle throughout a charging cycle. When the trend in the duty cycle indicates an anomaly, a thermal runaway condition is indicated. Whenever a thermal runaway condition is indicated, the battery charger 100 will abort the charge, and the display device 114 will indicate a bad battery. Commonly owned U.S. Pat. No. 7,834,593 describes additional suitable methods for detecting a thermal runaway condition. For example, the processor 128 may also identify a thermal runaway condition when the battery 104 voltage fail to continually ramp up, or when additional charging current (beyond the nominal) is required to achieve dv/dt:0. Likewise, the processor 128 can identify a thermal runaway condition when the battery 104 voltage fails to reach a predetermined voltage within a predetermined amount time Internal Impedance/Conductance Calculations. The battery charger 100 may also dynamically calculate and monitor the internal impedance and/or conductance of the battery 104 to determine whether the battery has a low SoH by measuring the internal resistance of the battery 104. As can be appreciated, the conductance of the battery 104 is simply the inverse of the impedance.

If the internal resistance of a battery is too high, excess energy will be dissipated inside the battery 104 (e.g., as heat) and the battery 104 may have insufficient power to achieve its intended purpose, for example starting a vehicle. Therefore, a battery with a high internal resistance (i.e., greater than a predetermined resistance value) is deemed to have a low SoH and the display device 114 will accordingly indicate that the battery is bad. The internal resistance of the battery normally increases as the battery ages. A battery with a measured (or calculated) internal resistance that is less than 60% of its rated internal resistance will typically have insufficient power to start an engine under all conditions and, therefore, should be replaced. Accordingly, a battery with an internal resistance that is less than 60% of their rated internal resistance may be flagged as a bad battery.

To determine the internal resistance of the battery 104, the battery charger 100 may dynamically compare the open circuit voltage ($V_{OC}$) of the battery 104 to the voltage of the battery 104 when a current is applied. Equation 1 provides a formula for calculating the internal resistance (R) of a given battery 104, where V is the voltage measured across the battery's 104 terminals when a predetermined current (I) is applied to the battery 104.

$$V = V_{OC} - (I*R) \qquad \text{Equation 1}$$

Figure 3:
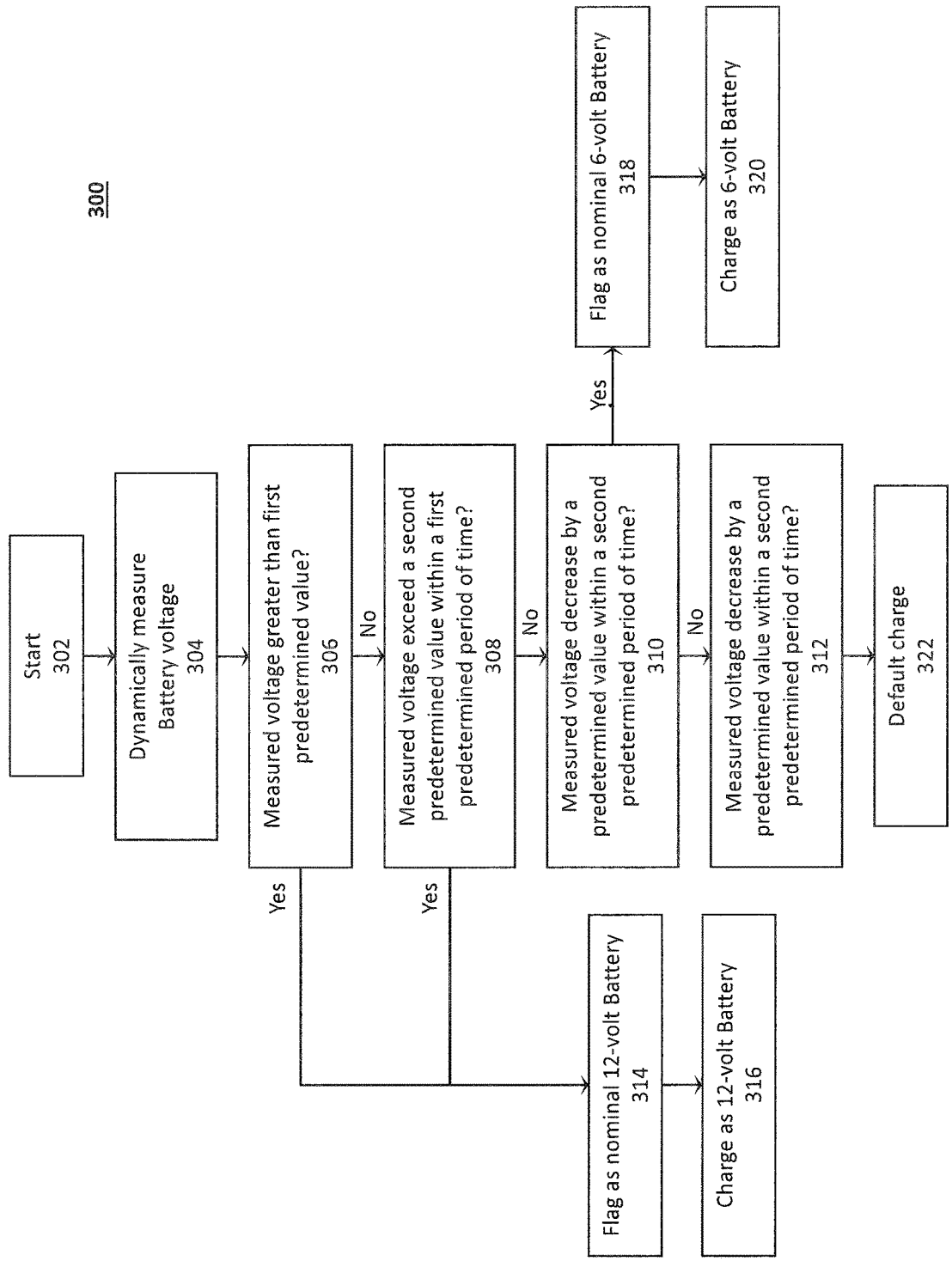
FIG. 3 illustrates a flow diagram of an exemplary nominal voltage detection cycle.

In certain aspects, the battery 104 may be modeled as a resistor-capacitor (RC) circuit 900 to determine, inter alia, the impedance and conductance. For example, a lead-acid battery can be modeled as a Randles equivalent electrical circuit. FIG. 3 illustrated an example RC circuit 900 having a first resistor 902 in series with two parallel resistor-capacitor combinations, including a first capacitor 906 in parallel with a second resistor 904 and a second capacitor 908 in parallel with a third resistor 910. The first resistor 902 models the resistance of the battery's 104 terminals and inter-cell connections (e.g., between about 5 and 100 me), whereas the second resistor 904 (10-500 mΩ) and the first capacitor 906 (e.g., between about 1,000 and 20,000 farad (F)) represent transient effects resulting from shifting ion concentrations and plate current densities. The third resistor 910 represents the self-discharge resistance (approximately 5 kΩ) of the battery 104, while the second capacitor 908 represented the battery's 104 main charge storage (i.e., capacity), which is an equivalent to $\sim 1 \times 10^5$ farad (F) for a fully charged healthy nominal 12-volt battery. The voltage across second capacitor 908 is a suitable indicator of SoC, whereas the SoH is inferred by observing a significant change in the second capacitor 908 over time due to aging effects of the battery 104, such as active mass degradation and crystallization of the active mass. While the RC circuit 900 is a suitable technique for determining a battery's 104 SoH and/or SoC, other modeling circuits are contemplated. For example, Gould discloses an adaptive battery model based on a variant of the Randles' lead-acid model. See Gould, C. R., et al., "*New Battery Model and State-of-Health Determination Through Subspace Parameter Estimation and State-Observer Techniques*," IEEE Transactions on Vehicular Technology (Volume: 58, Issue: 8, October 2009). In another example, the internal resistance may be calculated using Kelvin four-wire sensing.

In operation, the battery charger 100 may be configured to output a known input signal (e.g., a test signal, such as a predetermined AC signal) to the battery 104 via the DC output 136 and to dynamically monitor and record the battery's 104 response (e.g., a voltage waveform) to the known input signal. The processor 128 can then compare the battery's 104 response with the known input signal (e.g., using Ohm's law) to calculate the impedance and/or conductance of the battery 104.

Capacity Calculations. The battery charger 100 may also dynamically calculate and monitor the capacity of the battery 104 to determine whether the battery has a low SoH. In connection with secondary batteries, capacity generally refers to the available number of amp hours that the battery 104 can discharge into a load. If the capacity of the battery 104 is lower than a predetermined capacity value, the battery charger 100 will determine that the battery 104 has a low SoH and the display device 114 will accordingly indicate that the battery 104 is bad. For example, if after a predetermined time value charging the battery 104 does not reach a predetermined capacity (e.g., 225 A for 3 seconds), then the battery 104 is deemed to have a low SoH, and the display device 114 will indicate a bad battery condition.

In certain aspects, the capacity can be derived from the conductance of the battery. For example, the phase shift of the response to the known input signal can be used to determine the proportions of the impedance that are reactive and resistive, where the reactive component represents the capacity of the battery 104 and the resistive component represents the internal resistance of the battery 104. The processor 128 can compare the conductance to values stored in the read only memory 118 or data storage 122 to estimate the battery's 104 current capacity.

In another embodiment, after a predetermined time value in maintain mode (e.g., 4 to 16 hours, more preferably 6 to 12 hours, and most preferably, about 8 hours) the battery charger 100 will measure the $V_{OC}$ of the battery 104, which corresponds to the capacity in a rested battery. The processor 128 can then compare the measured $V_{OC}$ to values stored in the read only memory 118 or data storage 122 to determine the battery's 104 current capacity. The processor may also take in to account the temperature of the battery in its calculations. If the processor 128 determines that the capacity is lower than a predetermined value, then the battery 104 is deemed to have a low SoH. The typical lead acid battery has a nominal $V_{OC}$ of 12.8 volts. If the $V_{OC}$ value drops more than 3% within an 8 hour period and the batteries SoH is below 60%, the lead acid battery should be replaced. The display device 114 will accordingly indicate that the battery is bad.

12-Volt Lead Acid Battery Example. By way of illustration, an example bad battery process for identifying a bad battery condition via a battery charger 100 having a display device 114 during a charging process of a six-cell nominal 12-volt lead acid battery 104 will be described in accordance with one embodiment. The example bad battery process may be perform once per charge cycle, periodically, or upon instruction from a user. Upon start up, for example, the battery charger 100 may measure, using a voltage sensor, a first battery voltage of a lead acid battery 104 connected to the battery charger 100 across a pair of electrical conductors 172a, 172b. The battery charger 100 may then compare the first battery voltage to a first predetermined voltage value (e.g., about 12.0 to 12.4 volts, 2.0 to 2.067 $V_{CELL}$, or about 12.2 volts, 2.034 $V_{CELL}$) stored to the memory device, using, for example, a processor 128 operatively coupled with a memory device (e.g., ROM 118, RAM 120, and/or other data storage 122). If the first battery voltage is less than the first predetermined voltage value, the battery charger 100 may then measure a second battery voltage of the lead acid battery 104 using the voltage sensor after a first period of time (e.g., 1 minute to 10 minutes, or about 5 minutes). The battery charger 100 may then compare the second battery voltage to a second predetermined voltage value (e.g., about 14.0 to 16.0 volts, 2.334 to 2.667 $V_{CELL}$, or about 14.2 volts, 2.367 $V_{CELL}$) stored to the memory device using the processor 128. If the second battery voltage is greater than or equal to the second predetermined voltage value, the battery charger 100 may display a bad battery indicator via the display device 114. In addition to displaying the bad battery indicator, the battery charger 100 may further abort the charging process if the second battery voltage is greater than or equal to the second predetermined voltage value. Alternatively, in an attempt to repair the lead acid battery 104, the battery charger 100 may commence a desulfation process 500 (or portion thereof) if the second battery voltage is greater than or equal to the second predetermined voltage value.

The battery charger 100 may periodically check the lead acid battery 104 to determine whether the lead acid battery 104 has started to accept a charge, for example, after or during the desulfation process 500. For example, if the second battery voltage is greater than or equal to the second predetermined voltage value, the battery charger 100 may measure a third battery voltage of the lead acid battery 104 connected across the pair of electrical conductors 172a, 172b after a second period of time (e.g., 1 minute to 10 minutes, or about 5 minutes). The battery charger 100 may compare the third battery voltage to the second predetermined voltage value stored to the memory device using the processor 128. If the third battery voltage is less than or equal to the second predetermined voltage value, the battery charger 100 may instruct the display device 114 to not display (e.g., disable) the bad battery indicator. If, however, the third battery voltage is less than the second predetermined voltage value, upon detection of a lack of progress (i.e., the third battery voltage is within a predetermined deviation of the second battery voltage, which may be a function of the second period of time), and/or upon detection of a thermal runaway condition, the battery charger 100 may instruct the display device 114 to continue displaying (e.g., enable) the bad battery indicator, whereupon the battery charger 100 may further abort the charging process.

Lithium SoH Monitoring. The battery charger 100 can also determine whether a lithium battery is deemed to have a low SoH based on its charging characteristics. During the charging phase, the battery charger 100 dynamically records the battery 104 voltage and the current through the battery 104. The processor 128 continuously compares the battery 104 voltage and current to determine whether the current draw is too low for the measured voltage. For example, if the battery 104 voltage is between 2 volts (0.333 $V_{CELL}$) and 8 volts (1.334 $V_{CELL}$), and the current accepted is less than 800 mA, then the processor will determine that the lithium battery is deemed to have a low SoH. The display device 114 may then indicate that the battery 104 is bad.

Figure 11:
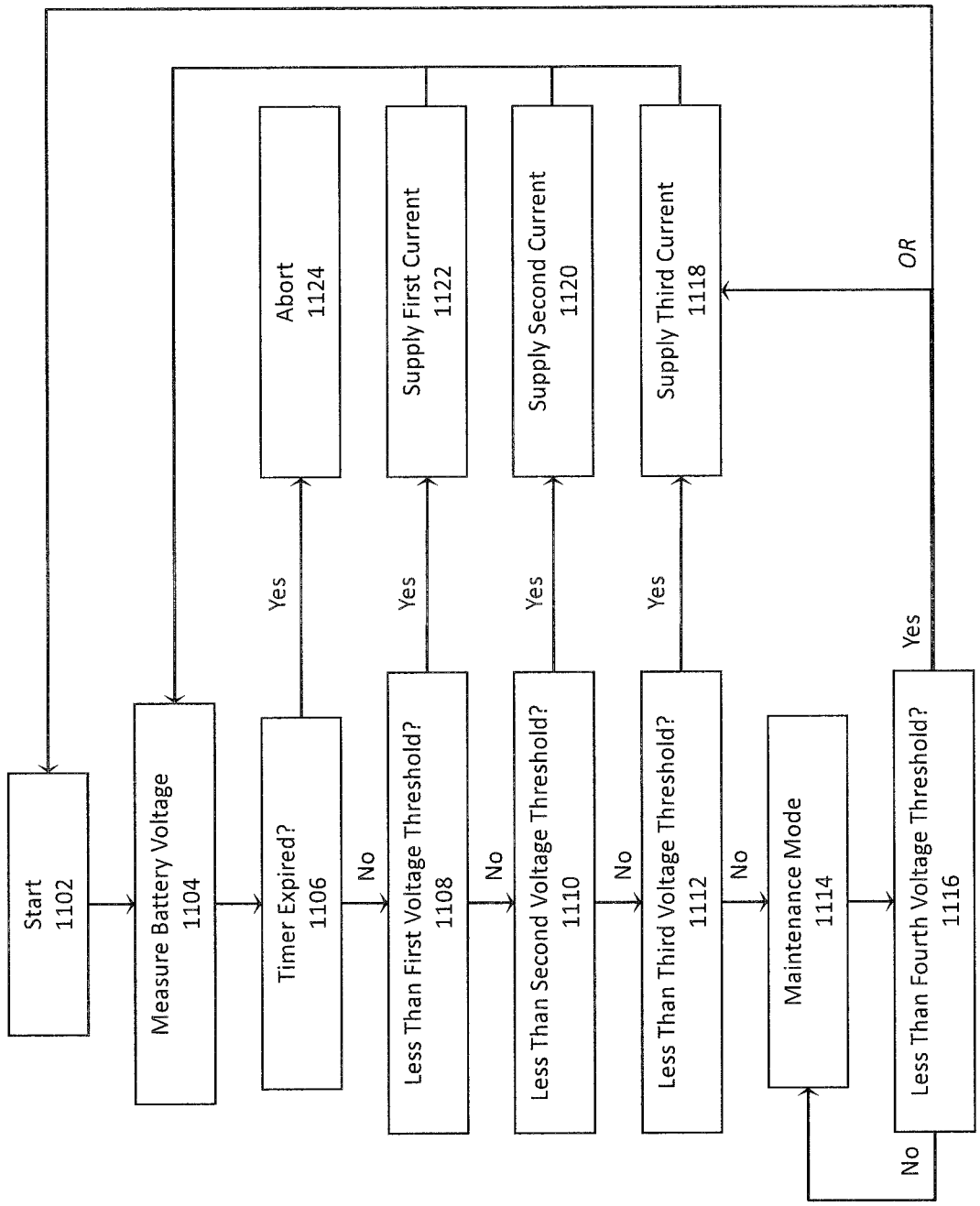
FIG. 11 illustrates a flow diagram of an exemplary lithium charging cycle.

FIG. 11 illustrates an example lithium charging cycle 1100 for identifying a bad battery condition during a charging process of a lithium battery 104. The lithium charging cycle 1100 starts at step 1102. At step 1102, the battery charger 100 measures (e.g., via a voltage sensor, which may be measure dynamically), the battery voltage (a measured battery voltage) of a lithium battery 104 connected to the battery charger 100 (e.g., across a pair of terminals or clamps).

At step 1104, the processor 128, via a voltage sensor, determines a voltage of the lithium battery 104. The processor 128 may be configured to determine the voltage dynamically, periodically (e.g., at regular intervals), or upon a triggering event.

At step 1106, the processor 128 determines whether a timer has expired. If the timer has expired, the lithium charging cycle 1100 may abort/terminate at step 1124 until reset or restarted. If the lithium charging cycle 1100 aborts at step 1124, the battery charger 100 may display a bad battery indicator via the display device 114. Otherwise, the lithium charging cycle 1100 proceeds to step 1108.

The timer may be purely a function of time or a function of both time and of battery voltage measured during the lithium charging cycle 1100 (e.g., at step 1104). For example, the lithium charging cycle 1100 may be configured to charge the lithium ion battery only for a predetermined total period of time (e.g., 5 to 15 hours, more preferably about 10 hours), whereby the lithium charging cycle 1100 may abort/terminate until reset, restarted, or after a predetermined rest period of time to allow the battery to rest or cool off. In another example, if the measured battery voltage is less than a predetermined voltage value (e.g., about 8.0 to 12.0 volts, 1.333 to 2.0 $V_{CELL}$, more preferably about 10.0 volts, 1.667 $V_{CELL}$) after a period of time (e.g., about 1 to 3 hours, more preferably about 2 hours), the processor 128 may determine that the lithium ion battery is not accepting a charge (also indicating a bad battery condition, which can trigger the bad battery indicator via the display device 114) and the lithium charging cycle 1100 should be terminated.

At step 1108, the processor 128 compares the measured battery voltage to a first predetermined voltage value (e.g., about 5.0 to 10.0 volts, 0.834 to 1.667 $V_{CELL}$, more preferably about 8.0 volts, 1.334 $V_{CELL}$). If the measured battery voltage is less than the first predetermined voltage value, the battery charger 100 supplies a first current (e.g., about 0.01 to 0.5 A, more preferably about 0.1 A) to the lithium battery 104 for a first period of time at step 1122.

At step 1110, the processor 128 compares the measured battery voltage to a second predetermined voltage value (e.g., about 8.0 to 12.0 volts, 1.334 to 2.0 $V_{CELL}$, more preferably about 10.0, 1.667 $V_{CELL}$). If the measured battery voltage is less than the second predetermined voltage value (but greater than the first predetermined voltage value), the battery charger 100 supplies a second current (e.g., about 0.25 to 1.0 A, more preferably about 0.5 A) to the lithium battery 104 for a first period of time at step 1120.

At step 1110, the processor 128 compares the measured battery voltage to a second predetermined voltage value (e.g., about 8.0 to 12.0 volts, more preferably about 10.0). If the measured battery voltage is less than the second predetermined voltage value (but greater than the first predetermined voltage value), the battery charger 100 supplies a second current (e.g., about 0.25 to 1.0 A, more preferably about 0.5 A) to the lithium battery 104 for a second period of time 1120.

At step 1112, the processor 128 compares the measured battery voltage to a third predetermined voltage value (e.g., about 14 to 15.0 volts, more preferably about 14.2). The third predetermined voltage value may be a fully charged voltage for battery. The fully charged voltage may be dictated by the manufacturer's rating for the battery (i.e., per the battery manufacturer specifications) or a predetermined voltage value associated with a fully charged battery for a particular application. For example, a six-cell nominal 12-volt battery's fully charged voltage may be set to 14.2 volts, which equates to 2.367 $V_{CELL}$.

If the measured battery voltage is less than the third predetermined voltage value (but greater than the second predetermined voltage value), the battery charger 100 supplies a third current (e.g., about 1.0 to 3.0 A, more preferably about 2.0 A) to the lithium battery 104 for a third period of time at step 1118. If the measured battery voltage third predetermined voltage value is greater than or equal to the third predetermined voltage value at step 1112, the battery charger 100 enters a maintenance mode at step 1114. During the maintenance mode, the battery charger 100 may periodically supply a maintaining current (e.g., about 0.1 to 0.4 A, more preferably about 0.2 A) to the lithium battery 104.

The battery charger 100 may also periodically measure the voltage of the lithium battery 104 and, if the measured voltage drops below a fourth predetermined voltage value (e.g., about 12.5 to 13.5 volts, 2.083 to 2.25 $V_{CELL}$, more preferably about 13.1, 2.183 $V_{CELL}$), the battery charger 100 may return to step 1102 to restart the lithium charging cycle 1100, or simply supply the third current at step 1118.

Automatic Nominal Voltage Detection 300. The battery charger 100 may be configured with an automatic nominal voltage detection function whereby the battery charger 100 can determine the nominal voltage of the battery 104. When presented with nominal 6-volt and 12-volt batteries, the battery charger 100 may determine that the battery 104 is a nominal 12-volt battery (as opposed to a nominal 6-volt battery) if the original voltage upon connection of the battery 104 to the battery charger 100 is greater than a first predetermined voltage (e.g., about 7-10 volts, more preferably about 8 volts); otherwise a decision on the battery type may not be made until one of a plurality of conditions is met. As a first example, if the battery 104 voltage exceeds a second predetermined voltage (e.g., about 9 to 12-volts, more preferably about 10 volts) within a predetermined timeframe (e.g., within 48 hours, more preferably within about 36, most preferably within about 24 hours), the battery charger 100 may determine that the battery 104 is a 12-volt battery. As a second example, if the battery 104 voltage decreases by a third predetermined voltage (e.g., 0.1 or more volts); the battery charger 100 may determine that the battery 104 is a 6-volt battery (e.g., a three-cell 6-volt battery).

FIG. 3 shows an exemplary automatic voltage detection process 300. As illustrated the battery charger 100 may determine, for example, whether a battery is a nominal 12-volt battery (six-cell) or a nominal 6-volt battery (three-cell). The process starts at step 302, where the battery charger 100 proceeds to dynamically measure the voltage of the battery 104 at step 304. If the measured voltage is greater than first predetermined value at step 306, then the battery charger 100 flags the battery as a nominal 12-volt battery at step 312. Otherwise, the process proceeds to the next step. At step 308, the battery charger 100 determines whether the measured voltage exceeds a second predetermined value within a first predetermined timeframe. If the measured voltage exceeds the second predetermined value within the first predetermined timeframe at step 308, then the battery charger 100 flags the battery 104 at step 314 as a nominal 12-volt battery. Otherwise, the process proceeds to the next step. At step 316, the battery charger 100 charges the battery in accordance with a charging protocol for a nominal 12-volt battery. At step 310, the battery charger 100 determines whether the measured voltage has decreased by a predetermined value within a second predetermined timeframe. If the measured voltage has decreased by a predetermined value within a second predetermined timeframe, then the battery charger 100 flags the battery as a 6-volt battery at step 318. Otherwise, the process proceeds to the next step. At step 320, the battery charger 100 charges the battery in accordance with a charging protocol for a 6-volt battery. At step 306, the battery charger 100 charges the battery in accordance with a default charging protocol, which may be, for example, the protocol for a 6-volt battery.

While the above automatic nominal voltage detection 300 techniques are discussed in connection with nominal 6-volt and 12-volt batteries, the principles may be similarly applied and adapted to other nominal battery voltages, such as 24-, 36-, and 48-volt batteries (e.g., typically ~2.0 nominal volts per cell), by scaling the predetermined value thresholds. For example, to automatically distinguish between nominal 12-volt and 24-volt batteries, the predetermined value thresholds may be multiplied by two.

Figure 4:
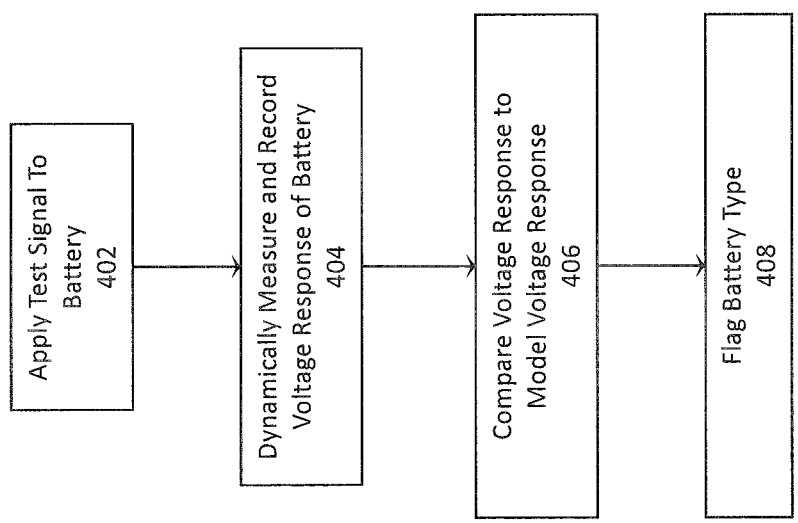
FIG. 4 illustrates a flow diagram of an exemplary battery type detection cycle.

Automatic Battery Type Detection 400. The battery charger 100 may be configured with automatic battery type detection (e.g., AGM, gel, lithium ion, etc.). FIG. 4 shows an exemplary battery type detection process 400 for determining the battery type. For example, after determining the nominal battery voltage, the battery charger 100 may send a test signal to the battery 104 at step 402. The battery charger 100 will then dynamically monitor and record the voltage response of the battery 104 in the random access memory 120 at step 404. The processor 128 can then compare the voltage response to predetermined voltage responses stored in either the data storage 122 or the read only memory 118 at step 406 using, for example, a lookup table. The lookup table may include a plurality of known battery types (e.g., lead-acid, lithium, etc.) and associated voltage response characteristics or ranges. Battery type can be determined by applying a constant current charge and measuring the rate of change of voltage (dv/dt) as the battery charges from, for example, 70% to 80% SoC.

Figure 10A:
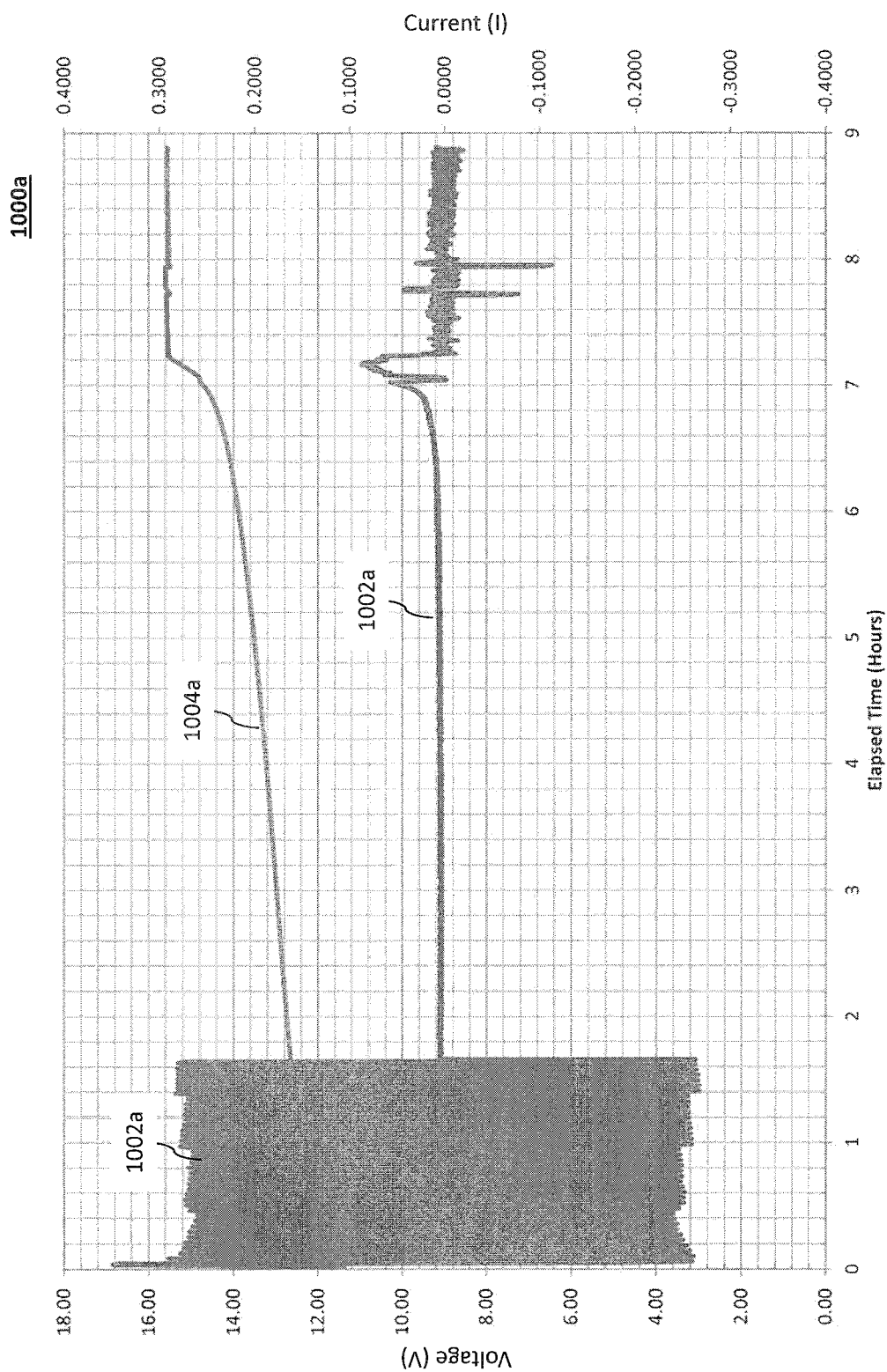

By way of illustration, the charge curve at FIG. 10*a* illustrates a graph 1000*a* of a dv/dt curve 1002*a* vis-à-vis a battery voltage curve 1004*a* for a 22 AH AGM battery being charged with a 2.0 A constant current charge. For purposes of this illustration, the dv/dt is measured at 60 second intervals from 14.0 to 14.7 volts (2.334 to 2.450 $V_{CELL}$). The maximum dv/dt is below 0.04V, which is characteristic of an AGM battery. At the 80% SoC, charge level as the charger normally switches to the di/dt stage because the battery will no longer accept the bulk rate current. FIG. 10*b* illustrates a graph 1000*b* of a dv/dt curve 1002*b* vis-à-vis a battery voltage curve 1004*b* for a 120 minute reserve capacity flooded lead acid battery being charged with a 2.0 A constant current charge. For purposes of this illustration, the dv/dt is measured at 60 second intervals from 11.34 to 14.77 volts (1.890 to 2.462 $V_{CELL}$). This allows a relatively small amount of current to be used to test a wide range of battery capacities. Based on this comparison, the processor 128 can identify the battery type and flag it accordingly at step 408.

In another example, the battery charger 100 may apply a test load to the battery 104 and then record the response of the battery 104 to the test load in the random access memory 120. The processor 128 can then compare the response to the load to predetermined load responses stored in either the data storage 122 or the read only memory 118. The load applied to the battery 104 is a percentage to the current required to start a vehicle. Measuring the corresponding voltage drop and multiplying that by the percentage gives the expected drop during that actual engine start. If that value is below the nominal required voltage, the battery SoH is determined to be below 60% and the battery 104 should be replaced. Based on this comparison, the processor 128 can identify the battery type. In another example, a voltage may be applied to the battery 104 in series with a known resistance to form a voltage divider circuit. The voltage across the battery 104 may then be measured to determine the impedance of the battery 104. Different battery types have different impedances values, therefore the processor 128 can determine the battery type by comparing the calculated impedance to values stored in the read only memory 118 and/or the data storage 122.

A temperature sensor may record the temperature of the battery 104 and deliver the information to the processor 128. The temperature of the battery may affect the responses of the battery to loads and voltages. The processor may be capable of figuring the temperature of the battery 104 into its response comparisons. In certain aspects, the read only memory 118 or data storage 122 may have voltage and load responses stored corresponding to various battery types at various temperatures.

Figure 5:
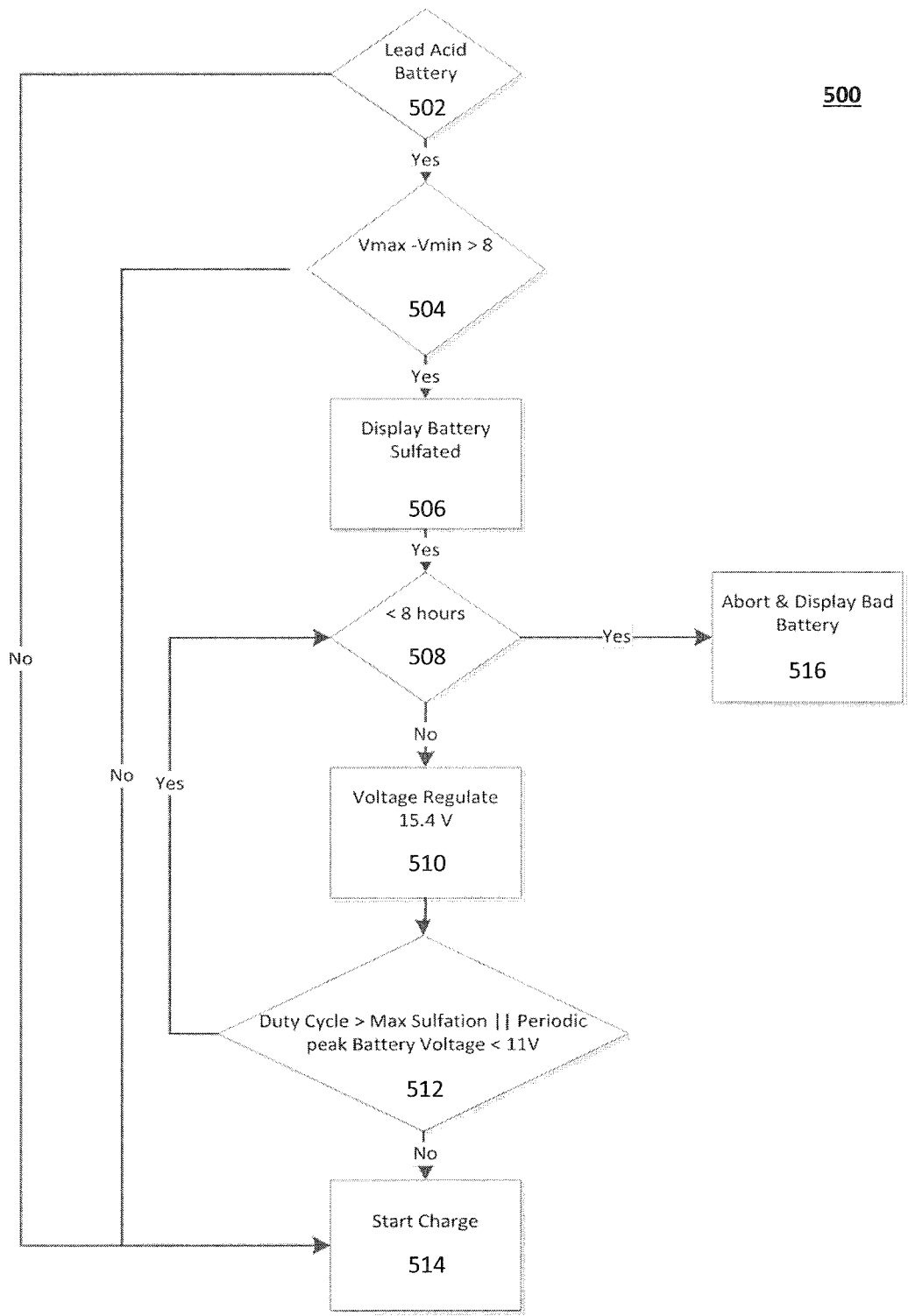
FIG. 5 illustrates a flow diagram of an exemplary desulfation cycle.

Desulfation Mode 500. FIG. 5 illustrates an exemplary desulfation process 500. If the system determines that the battery 104 is a lead-acid battery, then during the first portion of the charging cycle (e.g., during a soft start mode 208), the system checks for a sulfation condition. A sulfation condition is typically indicated by a low initial voltage followed by a rapid rise in voltage once the battery 104 is connected to the charger. For example in a 12-volt battery, if the peak voltage is >11 volts, for example, but the initial voltage was less than 3 volts, for example, the system assumes a sulfation condition exists and initiates a desulfation charge.

At step 502, the battery charger 100 determines whether the battery 104 is a lead-acid battery (e.g., using the battery type detection process 400). At step 504, the battery charger 100 (via processor 128) determines whether the battery 104 is sulfated. Sulfation detection may be accomplished by continuously monitoring the difference between $V_{MAX}$ and $V_{MIN}$. If the difference is more than a predetermined value (e.g., 8 volts), then the battery 104 is considered to be in a sulfated condition and will indicate that the battery 104 is sulfated on the display device 114 at step 506. As illustrated at steps 508 through 512, the desulfation charge is conducted for a predetermined timeframe (e.g., 8 hours, as indicated at step 508). After the predetermined timeframe, the desulfation charge is terminated at step 516. During the desulfation charging period, the battery 104 voltage is regulated at a predetermined voltage (e.g., 5.4 volts), by way of current pulses applied to the battery 104 at step 510. The current pulses are applied to the battery 104 until the battery 104 accepts a charge at step 512. If the battery 104 accepts a charge at step 512, then the battery charger 100 may start a normal charge cycle at step 514.

The processor 128 can determine whether the battery 104 is accepting the charge by comparing the duty cycle to the max sulfation, and by comparing the periodic peak voltage to a predetermined voltage (e.g., 11 volts). Specifically, if the duty cycle is greater than the max sulfation or the periodic peak voltage is less than a predetermined voltage (e.g., 11 volts), the battery 104 is determined to not be accepting a charge, and the desolation process continues to step 508.

If the battery 104 does not recover within a predetermined amount of time (e.g., 8 hours), the battery charger 100 will abort the desulfation process 500. The processor 128 will determine that the battery 104 is deemed to have a low SoH, and the display device 114 will indicate that the battery 104 has gone bad at step 516. If the battery is deemed to be desulfated (i.e., accepting a charge) at step 512, the charging cycle will start at 514. Commonly owned U.S. Pat. No. 8,575,899 B2 describes a process for determining whether a battery is sulfated as well as the desulfation process during a desulfation mode.

Figure 6:
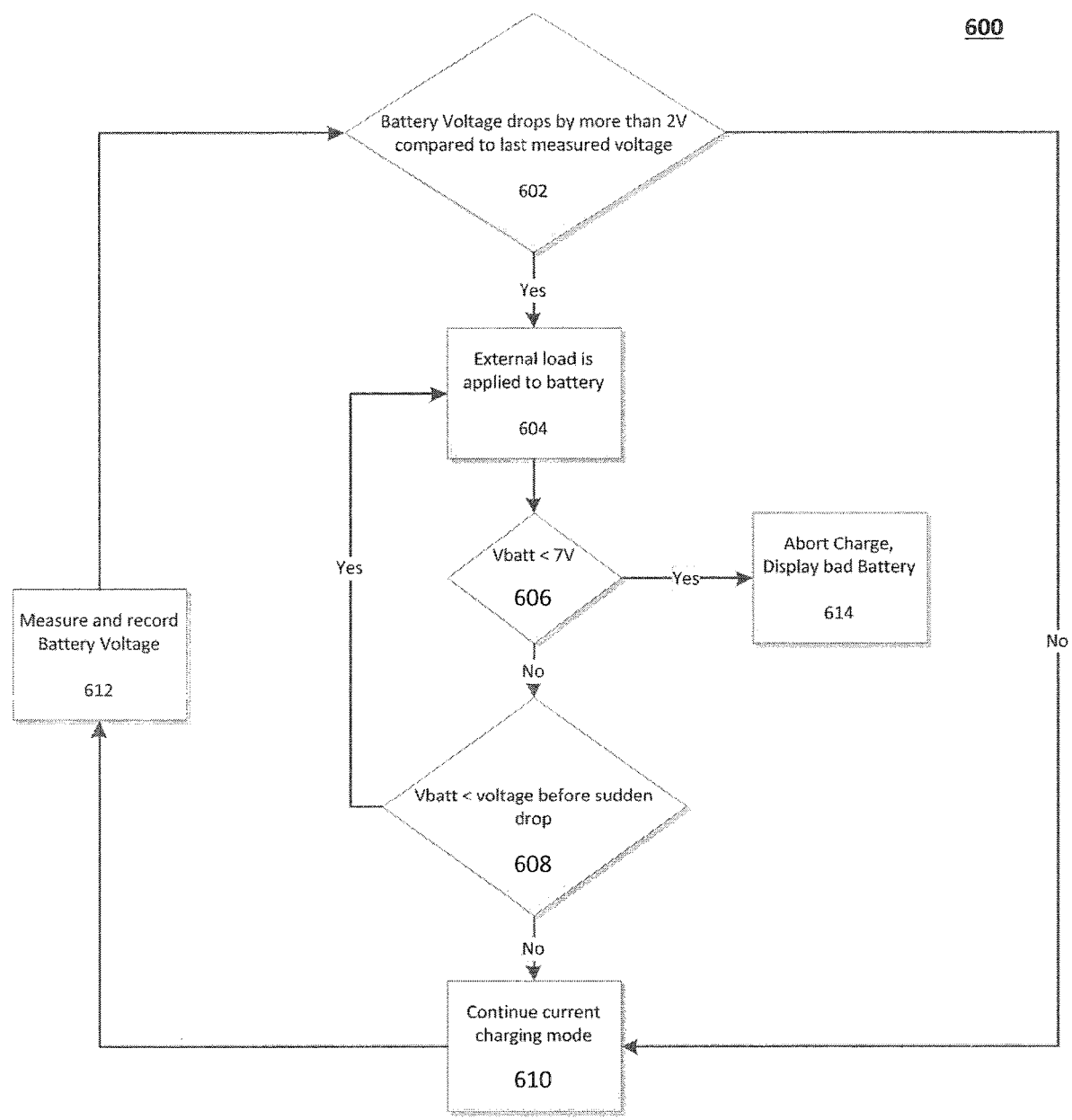
FIG. 6 illustrates a flow diagram of an exemplary load detection cycle.

Load Detection Cycle 600. FIG. 6 shows an exemplary load detection cycle 600 for use in the battery charger 100. A substantial voltage drop across the battery 104 indicates that an engine coupled to the battery 104 is attempting to start. Therefore, throughout a charging cycle, the processor 128 may perform the load detection cycle 600 in a loop to dynamically monitor the battery 104 until a drop is detected at step 602, otherwise the load detection cycle 600 proceeds to step 610, where the battery charger 100 continues its current charging mode.

At step 602, a drop in voltage indicates to the processor 128 that an engine coupled to the battery 104 is starting or attempting to start. If a drop in voltage is detected at step 602, the load detection cycle 600 proceeds to step 604. At step 604, a predetermined external load is applied to the battery 104. The processor 128 will then record the lowest battery voltage during the remainder of the engine-starting phase. If, during this phase, the battery 104 voltage drops below a predetermined value, then the battery 104 is deemed to have a low SoH and the display device 114 will indicate as such (e.g., displace a bad battery indicator). For example, for a nominally 12-volt battery, if the voltage drops below 7 volts during this phase at step 606, the battery 104 is deemed to have a low SoH. The processor 128 will recognize the low SoH, and output to the display device 114 that the battery 104 is bad at step 614 and the charging operation or mode may be aborted.

If the voltage drops remains at or above 7 volts at step 606, the process continues to step 608. At step 608, the processor 128 compares the current voltage of the battery to the voltage of battery before ignition attempt (e.g., the last stored voltage). If the current voltage is less than the voltage before the sudden drop at step 608, then the external load is reapplied at step 604 and the battery test is repeated. If the current voltage is greater than or equal to the voltage before the sudden drop at step 608, the battery charging process continues at step 610, where the battery charger 100 continues (or returns to) its current charging mode. Upon returning to the charging mode at step 610, the battery charger 100 dynamically measures and records battery voltage at step 612 until a drop in voltage is detected to indicate at step 602 that an engine coupled to the battery 104 is starting or attempting to start.

Figure 7:
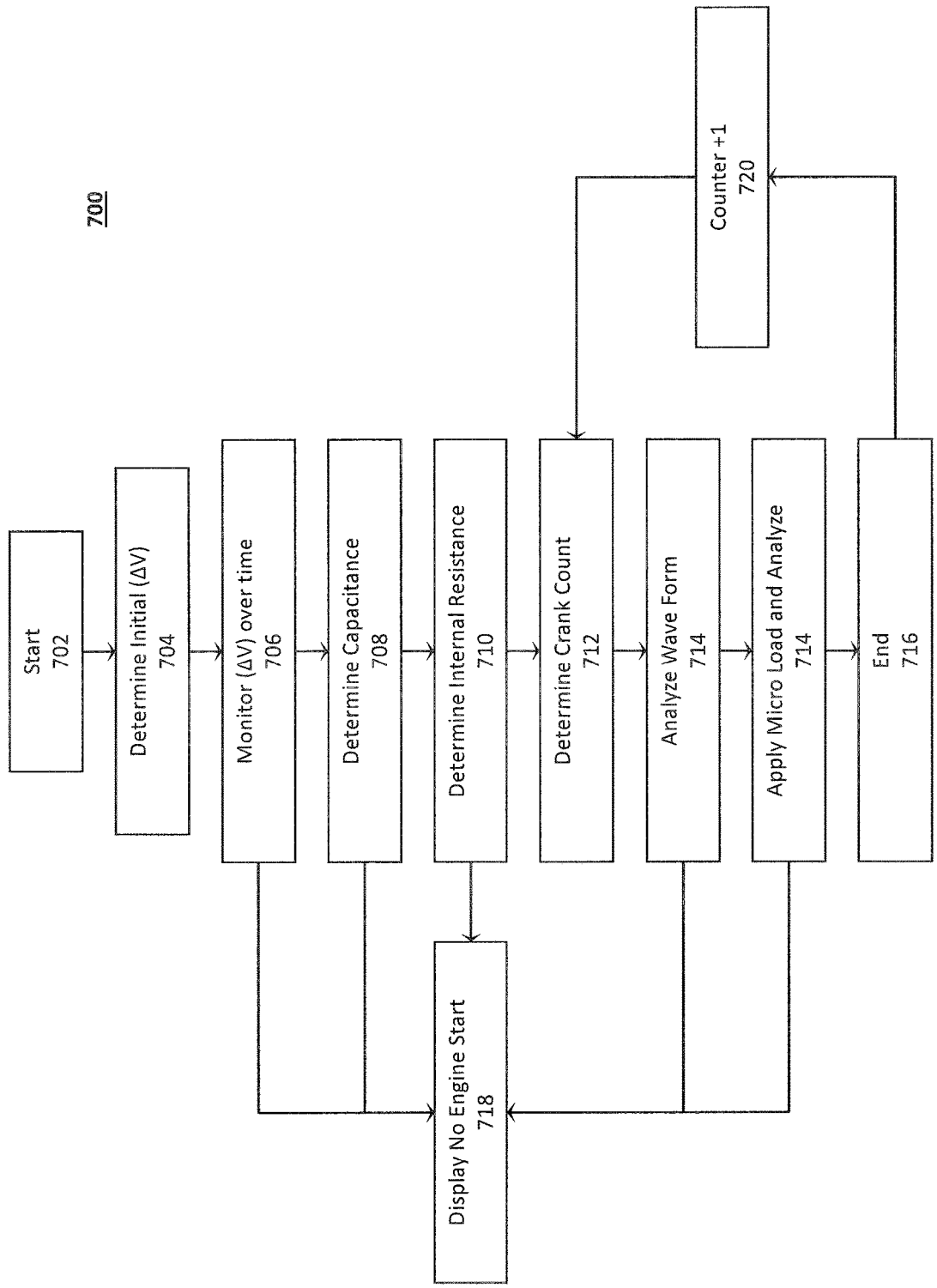
FIG. 7 illustrates a flow diagram of an exemplary battery engine-start detection cycle.

Battery Engine-Start Detection Cycle 700. In addition to, or in lieu of, the forgoing battery SoH determination and display methods, the display device 114 may display whether a battery is sufficiently charged and/or in a sufficient SoH such that it can start a vehicle. Accordingly, the display device 114 may be configured to provide an indication (e.g., icons, words, etc.) that the battery 104 is not expected to start an engine based at least in part on the SoC and/or SoH of the battery 104. FIG. 7 shows an exemplary battery engine-start detection cycle 700 for use in the battery charger 100 or other device (e.g. vehicle, battery monitor, etc.). Upon startup at step 702, the processor 128 may cycle through one or more steps to determine whether the battery 104 is capable of starting an internal combustion engine.

At step 704, the processor 128 determines an initial voltage difference ($\Delta V$). According to one aspect, the initial voltage difference ($\Delta V$) may be the initial difference between the peak and valley of the voltage signal. For example, the voltage difference ($\Delta V$) can be measured in the zero cross period of the 60 Hz AC input line (e.g., AC power supply 102).

At step 706, the battery charger 100 may supply a plurality of predetermined currents into the battery 104 and detect/monitor the results. This is possible for a number of reasons. First, the value of the voltage difference ($\Delta V$) will decrease as the battery 104 starts to accept a charge. Second, the value of the voltage difference ($\Delta V$) changes as a function of the amount of current being put into the battery 104 by the battery charger 100. By passing a plurality of different predetermined currents into the battery 104, the battery charger 100 can dynamically monitor and record the voltage response (e.g., the $\Delta V$) in the random access memory 120 at step 704. Using the voltage response, the processor 128 can generate a database of data comparing the current passed to the battery vs. the $\Delta V$. Using this database, the processor 128 can dynamically monitor the trend to determine whether the battery 104 is accepting a charge. If the processor 128 determines that the battery 104 is not accepting a charge, the display device 114 may be enabled to display (e.g., in addition to a bad battery condition) that the battery 104 is not expected to start the engine/vehicle at step 718.

At step 708, the battery charger 100 determines the capacity of the battery 104. If the processor 128 determines that the capacity is below a predetermined capacity threshold, the display device 114 may be enabled to display that the battery 104 is not expected to start the engine/vehicle at step 718.

At step 710, the battery charger 100 determines the internal resistance of the battery 104. If the processor 128 determines that the resistance is below a predetermined capacity threshold, the display device 114 may be enabled to display (e.g., in addition to a bad battery condition) that the battery 104 is not expected to start the engine/vehicle at step 718.

At step 712, the battery charger 100 determines the number of times an attempt has been made to start the vehicle, whereby each ignition or ignition attempt causes the counter to increment by one at step 720.

At step 714, the battery charger 100 analyzes the waveform during starting. For example, the processor 128 can compare two or more ignition waveforms (e.g., two consecutive ignition attempts) to compare the valley voltage of each waveforms. In addition, the consecutive starts will also help to recover some of the battery capacity. The minimum voltage required before either the starter solenoid or electronic ignition of the vehicle drops out is typically 6 volts. For example, if during a start attempt, the valley voltage drops below the 7.2-volt threshold or the percentage difference between the two consecutive is greater than 5%, the battery SoH is determined to be below 60% and the display device 114 may be enabled to display (e.g., in addition to a bad battery condition) that the battery 104 is not expected to start the engine/vehicle at step 718.

At step 716, the battery charger 100 is configured to apply a micro load (e.g., approximately 80 to 250 A) for a predetermined timeframe (e.g., 1 to 10 milliseconds, more preferably 2 to 7 milliseconds, most preferably 3 to 5 milliseconds). An analysis of the voltage response can be used to indicate the ability of the battery 104 to start the vehicle.

At step 718, the battery charger 100 is configured to enable the display device 114 to display that the battery 104 is not expected to start the engine/vehicle at step 718. For example, the display device 114 may display an icon (e.g., an engine graphic with a slash or X mark) or phrase (e.g., No Engine Start).

In another example, the battery charger 100 may apply a test load to the battery 104 and then record the response of the battery 104 (to the test load) in the random access memory 120. The processor 128 can then compare the response to the test load to predetermined load responses stored in either the data storage 122 or the read only memory 118. The load applied to the battery 104 is a percentage to the current required to start a vehicle. Measuring the corresponding voltage drop and multiplying that by the percentage gives the expected drop during that actual engine start. If that value is below the nominal required voltage, the battery SoH is determined to be below 60% and the battery 104 should be replaced. Based on this comparison, the processor 128 can identify the battery type. In another example, a voltage may be applied to the battery 104 in series with a known resistance to form a voltage divider circuit. The voltage across the battery 104 may then be measured to determine the impedance of the battery 104. Different batteries types have different impedances values, and the processor 128 can determine the battery type by comparing the calculated impedance to values stored in the read only memory 118 and/or the data storage 122.

As discussed above, in some embodiments, the battery charger 100 may be configured to charge or start (a/k/a "boost", "jump", or "jump start") an engine coupled to a battery. When starting an engine coupled to a battery, if the battery 104 voltage drops below a certain threshold voltage, there is an indication that the battery 104 is deemed to have a low SoH. Accordingly, if the battery 104 is considered insufficient for starting the vehicle's engine, the processor 128 may automatically initiate a jump-start mode to provide jump-starting functionality. In the jump-start mode, the battery charger 100 may use one or more of the auxiliary power source 108, the linear transformer, and/or the switched mode transformer to provide additional current to jump-start the vehicle.

While the various battery monitoring and battery testing techniques disclosed herein are described in connection with a battery charger to charge the battery, one of skill in the art would appreciate that one of more of the features, techniques, etc. may be embodied in other devices. The other devices may be include, inter alia, the vehicle itself (i.e., integral with one or more the onboard vehicle systems), a monitoring-only device (e.g., battery charger 100 without charging capability), portable battery jump starters (e.g., having an internal power source), etc. In certain aspects, for example, the various battery monitoring and battery testing techniques may be implemented as a pass through device that couples with a battery charger. For example, the pass through device may couple to the battery and received power from, and optionally send instructions (e.g., as feedback) to, a battery charger.

The above-cited patents and patent publications are hereby incorporated by reference in their entirety. Where a definition or the usage of a term in a reference that is incorporated by reference herein is inconsistent or contrary to the definition or understanding of that term as provided herein, the meaning of the term provided herein governs and the definition of that term in the reference does not necessarily apply. Although various embodiments have been described with reference to a particular arrangement of parts, features, and the like, these are not intended to exhaust all possible arrangements or features, and indeed many other embodiments, modifications, and variations will be ascertainable to those of skill in the art. Thus, it is to be understood that the teachings of the subject disclosure may therefore be practiced otherwise than as specifically described above.

What is claimed is:

1. A battery charger configured to identify a bad battery condition for a lead acid battery, the battery charger comprising:
   a processor operatively coupled with a voltage sensor;
   a non-transitory memory device operatively coupled with the processor;
   a power management device to receive an input power and to output a charging current during a charging process;
   a display device electrically coupled to the processor; and
   a pair of electrical conductors to electrically couple with the lead acid battery, wherein the battery charger is configured to:
   measure, via the voltage sensor, a first battery voltage of the lead acid battery connected across the pair of electrical conductors;
   supply, via the pair of electrical conductors, the charging current to the lead acid batter for a first period of time;
   measure, via the voltage sensor, a second battery voltage of the lead acid battery connected across the pair of electrical conductors after the first period of time;
   determine a rate of change of voltage (dv/dt) for the first period of time; and
   display a bad battery indicator via the display device if the rate of change of voltage (dv/dt) is less than a rate of change of voltage value.

2. The battery charger of claim 1, further comprising a wireless device configured to facilitate wireless communication between the processor and a portable electronic device.

3. The battery charger of claim 2, wherein the battery charger is configured to communicate data reflecting a bad battery condition to the portable electronic device via the wireless device.

4. The battery charger of claim 3, wherein the portable electronic device is configured to display a message or an icon representing the bad battery condition.

5. The battery charger of claim 1, wherein the battery charger is configured to commence a desulfation process if the rate of change is greater than or equal to a second rate of change of voltage value.

6. The battery charger of claim 5, wherein the battery charger is configured to display the bad battery indicator via the display device if a duration of the desulfation process exceeds a second period of time.

7. The battery charger of claim 1, wherein the battery charger further comprises a rechargeable lithium ion battery configured to supply the input power.

8. The battery charger of claim 7, wherein the battery charger is configured to display the bad battery indicator via the display device if a voltage of the rechargeable lithium ion battery is less than a voltage value.

9. The battery charger of claim 1, wherein the battery charger is configured to abort the charging process if the bad battery indicator is displayed via the display device.

10. A battery charger configured to identify a bad battery condition for a lead acid battery, the battery charger comprising:
- a processor operatively coupled with a voltage sensor;
- a non-transitory memory device operatively coupled with the processor;
- a power management device to receive an input power and to output a charging current during a charging process;
- a display device electrically coupled to the processor; and
- a pair of electrical conductors to electrically couple with the lead acid battery, wherein the battery charger is configured to:
  - measure, via the voltage sensor, a first battery voltage of the lead acid battery connected across the pair of electrical conductors;
  - supply, via the pair of electrical conductors, the charging current to the lead acid battery for a first period of time;
  - measure, via the voltage sensor, a second battery voltage of the lead acid battery connected across the pair of electrical conductors after the first period of time;
  - determine whether the second battery voltage is less than a voltage value; and
  - display a bad battery indicator via the display device if the second battery voltage is less than the voltage value.

11. The battery charger of claim 10, wherein the first period of time is about 2 hours and the voltage value is about 10 volts or less.

12. The battery charger of claim 10, further comprising a wireless device configured to facilitate wireless communication between the processor and a portable electronic device.

13. The battery charger of claim 12, wherein the battery charger is configured to communicate data reflecting a bad battery condition to the portable electronic device via the wireless device.

14. The battery charger of claim 13, wherein the portable electronic device is configured to display a message or an icon representing the bad battery condition.

15. The battery charger of claim 10, wherein the battery charger is configured to instruct the display device to display the bad battery indicator if a thermal runaway condition is detected.

16. The battery charger of claim 10, wherein the battery charger is configured to abort the charging process if the bad battery indicator is displayed via the display device.

17. A battery charger configured to identify a bad battery condition for a lead acid battery, the battery charger comprising:
- a processor operatively coupled with a sensor;
- a non-transitory memory device operatively coupled with the processor;
- a power management device to receive an input power and to output current during a charging process;
- a display device electrically coupled to the processor; and
- a pair of electrical conductors to electrically couple with the lead acid battery, wherein the battery charger is configured to:
  - measure, via the sensor, a first battery charge current delivered to the lead acid battery connected across the pair of electrical conductors;
  - supply, via the pair of electrical conductors, the charging current to the lead acid battery for a first period of time;
  - measure, via the sensor, a second battery charge current delivered to the lead acid battery connected across the pair of electrical conductors after the first period of time;
  - determine whether the second battery charge current is less than a current value; and
  - display a bad battery indicator via the display device if the second battery charge current is greater than the current value.

18. The battery charger of claim 17, further comprising a wireless device configured to facilitate wireless communication between the processor and a portable electronic device, wherein the battery charger is configured to communicate data reflecting a bad battery condition to the portable electronic device via the wireless device.

19. The battery charger of claim 18, wherein the portable electronic device is configured to display a message or an icon representing the bad battery condition.

20. The battery charger of claim 17, wherein the battery charger is configured to abort the charging process if the bad battery indicator is displayed via the display device.

\* \* \* \* \*